US009637838B2

(12) United States Patent
Coe et al.

(10) Patent No.: US 9,637,838 B2
(45) Date of Patent: May 2, 2017

(54) METHODS OF MANUFACTURING SYNTHETIC DIAMOND MATERIAL BY MICROWAVE PLASMA ENHANCED CHEMICAL VAPOR DEPOSITION FROM A MICROWAVE GENERATOR AND GAS INLET(S) DISPOSED OPPOSITE THE GROWTH SURFACE AREA

(75) Inventors: Steven Edward Coe, Ascot (GB); Jonathan James Wilman, Ascot (GB); Helen Wilman, legal representative, Leeds (GB); Daniel James Twitchen, Ascot (GB); Geoffrey Alan Scarsbrook, Ascot (GB); John Robert Brandon, Ascot (GB); Christopher John Howard Wort, Ascot (GB); Matthew Lee Markham, Ascot (GB)

(73) Assignee: Element Six Limited, Ballasalla (IM)

( * ) Notice: Subject to any disclaimer, the term of this patent is extended or adjusted under 35 U.S.C. 154(b) by 0 days.

(21) Appl. No.: 13/994,922

(22) PCT Filed: Dec. 14, 2011

(86) PCT No.: PCT/EP2011/072820
§ 371 (c)(1),
(2), (4) Date: Dec. 19, 2013

(87) PCT Pub. No.: WO2012/084656
PCT Pub. Date: Jun. 28, 2012

(65) Prior Publication Data
US 2014/0150713 A1    Jun. 5, 2014

Related U.S. Application Data

(60) Provisional application No. 61/439,322, filed on Feb. 3, 2011, provisional application No. 61/448,894, filed on Mar. 3, 2011.

(30) Foreign Application Priority Data

Dec. 23, 2010   (GB) .................................... 1021870.9
Feb. 18, 2011   (GB) .................................... 1102877.6

(51) Int. Cl.
*C30B 25/14*   (2006.01)
*C01B 31/06*   (2006.01)
(Continued)

(52) U.S. Cl.
CPC .............. *C30B 25/14* (2013.01); *C01B 31/06* (2013.01); *C23C 16/274* (2013.01);
(Continued)

(58) Field of Classification Search
CPC ......... C30B 25/00; C30B 25/02; C30B 25/14; C30B 25/16; C30B 25/165; C30B 29/00;
(Continued)

(56) References Cited

U.S. PATENT DOCUMENTS 4,869,923 A    9/1989   Yamazaki
4,943,345 A *  7/1990   Asmussen et al. ............. 216/69
(Continued)

FOREIGN PATENT DOCUMENTS

CN    101385129    3/2009
EP    0343602 A3   11/1989
(Continued)

OTHER PUBLICATIONS

M. Nagatsu, et al. publication entitled "Diagnostics of plasma ball formed in high pressure microwave plasma for diamond film synthesis," Diamond and Related Materials, vol. 11, pp. 562-566 (2002).*
(Continued)

*Primary Examiner* — Kenneth A Bratland, Jr.
(74) *Attorney, Agent, or Firm* — Dean W. Russell; Clark F. Weight; Kilpatrick Townsend & Stockton LLP

(57) ABSTRACT

Disclosed herein are methods of manufacturing synthetic CVD diamond material including orienting and controlling process gas flow in a microwave plasma reactor to improve performance. The microwave plasma reactor includes a gas
(Continued)

flow system with a gas inlet comprising one or more gas inlet nozzles disposed opposite the growth surface area and configured to inject process gases towards the growth surface area. The method comprises injecting process gases towards the growth surface area at a total gas flow rate equal to or greater than 500 standard cm³ per minute wherein the process gases are injected into the plasma chamber through the one or more gas inlet nozzles with a Reynolds number in a range 1 to 100.

14 Claims, 10 Drawing Sheets

(51) Int. Cl.
| | |
|---|---|
| C23C 16/27 | (2006.01) |
| C30B 29/04 | (2006.01) |
| H01J 37/32 | (2006.01) |
| C30B 25/02 | (2006.01) |
| C30B 25/16 | (2006.01) |

(52) U.S. Cl.
CPC .......... C23C 16/278 (2013.01); C30B 25/02 (2013.01); C30B 25/165 (2013.01); C30B 29/04 (2013.01); H01J 37/32192 (2013.01); H01J 37/32449 (2013.01)

(58) Field of Classification Search
CPC ......... C30B 29/02; C30B 29/04; C23C 16/00; C23C 16/22; C23C 16/26; C23C 16/27; C23C 16/274; C23C 16/455; C23C 16/278; C01B 31/06; H01J 37/32192; H01J 37/32449
USPC ..... 117/84, 88, 99, 102–104, 108, 928–929; 118/715, 722, 723 R, 723 MW
See application file for complete search history.

(56) References Cited

U.S. PATENT DOCUMENTS

| | | | |
|---|---|---|---|
| 4,989,542 A | | 2/1991 | Kamo |
| 5,091,208 A | | 2/1992 | Pryor |
| 5,258,206 A | | 11/1993 | Hayashi et al. |
| 5,261,959 A | | 11/1993 | Gasworth |
| 5,273,731 A | | 12/1993 | Anthony et al. |
| 5,273,790 A | | 12/1993 | Herb et al. |
| 5,302,226 A | | 4/1994 | Yamazaki et al. |
| 5,302,803 A | | 4/1994 | Stevens et al. |
| 5,311,103 A | | 5/1994 | Asmussen et al. |
| 5,397,396 A | | 3/1995 | Kosky et al. |
| 5,501,740 A | | 3/1996 | Besen et al. |
| 5,571,577 A | * | 11/1996 | Zhang et al. ............... 427/575 |
| 5,643,365 A | | 7/1997 | Blinov et al. |
| 5,683,759 A | | 11/1997 | Shepard, Jr. et al. |
| 5,981,057 A | | 11/1999 | Collins |
| 6,091,045 A | | 7/2000 | Mabuchi et al. |
| 6,106,678 A | | 8/2000 | Shufflebotham et al. |
| 6,158,383 A | | 12/2000 | Watanabe et al. |
| 6,254,683 B1 | | 7/2001 | Matsuda et al. |
| 6,319,439 B1 | | 11/2001 | Lee et al. |
| 6,325,018 B1 | | 12/2001 | Hongoh |
| 6,388,632 B1 | | 5/2002 | Murakawa et al. |
| 6,414,338 B1 | | 7/2002 | Anderson |
| 6,427,621 B1 | | 8/2002 | Ikegawa et al. |
| 6,433,298 B1 | | 8/2002 | Ishii |
| 6,487,986 B1 | | 12/2002 | Liehr et al. |
| 6,565,661 B1 | | 5/2003 | Nguyen |
| 6,645,343 B1 | | 11/2003 | Wild et al. |
| 6,793,733 B2 | | 9/2004 | Janakiraman et al. |
| 2001/0023663 A1 | | 9/2001 | Kazumi et al. |
| 2001/0036465 A1 | | 11/2001 | Ishll et al. |
| 2003/0107003 A1 | | 6/2003 | Whitehead |
| 2003/0150561 A1 | | 8/2003 | Ishii et al. |
| 2003/0150846 A1 | | 8/2003 | Ishii et al. |
| 2003/0200914 A1 | | 10/2003 | Noguchi et al. |
| 2004/0045674 A1 | | 3/2004 | Ishii et al. |
| 2005/0005853 A1 | | 1/2005 | Behle et al. |
| 2005/0109267 A1 | | 5/2005 | Linares et al. |
| 2005/0266606 A1 | | 12/2005 | Chevallier et al. |
| 2006/0266279 A1 | | 11/2006 | Mokuno |
| 2007/0163996 A1 | | 7/2007 | Horiguchi |
| 2007/0221294 A1 | | 9/2007 | Sasaki |
| 2008/0099768 A1 | | 5/2008 | Scarsbrook et al. |
| 2008/0134959 A1 | | 6/2008 | Kasu et al. |
| 2008/0156256 A1 | | 7/2008 | Linares et al. |
| 2008/0190356 A1 | | 8/2008 | Bhandari |
| 2008/0303744 A1 | | 12/2008 | Hirayama et al. |
| 2010/0028556 A1 | | 2/2010 | Linares et al. |
| 2010/0034984 A1 | | 2/2010 | Asmussen et al. |
| 2010/0101728 A1 | * | 4/2010 | Iwasaki ................... 156/345.33 |
| 2010/0178234 A1 | | 7/2010 | Noguchi |
| 2010/0189924 A1 | | 7/2010 | D'Evelyn et al. |

FOREIGN PATENT DOCUMENTS

| | | |
|---|---|---|
| EP | 0390209 A3 | 10/1990 |
| EP | 0447031 A1 | 9/1991 |
| EP | 0480581 | 9/1991 |
| EP | 0467043 A2 | 1/1992 |
| EP | 0487292 A1 | 5/1992 |
| EP | 0526657 A1 | 2/1993 |
| EP | 0546752 A1 | 6/1993 |
| EP | 0582397 A2 * | 7/1993 |
| EP | 0582397 A2 | 2/1994 |
| EP | 0597445 A2 | 5/1994 |
| EP | 0695816 A1 | 2/1996 |
| EP | 0727507 A2 | 8/1996 |
| EP | 0758688 A1 | 2/1997 |
| EP | 0822269 | 4/1998 |
| EP | 1500718 A1 * | 1/2005 |
| EP | 1643641 A2 | 4/2006 |
| EP | 1463849 | 1/2007 |
| EP | 2108714 A1 | 10/2009 |
| FR | 2798552 | 3/2001 |
| JP | 562162366 A | 7/1987 |
| JP | S62167886 A | 7/1987 |
| JP | S62235393 A | 10/1987 |
| JP | H01308896 A | 12/1989 |
| JP | 03281594 C2 | 12/1991 |
| JP | 4009471 A | 1/1992 |
| JP | H04-035029 A | 2/1992 |
| JP | H04-187594 A | 6/1992 |
| JP | 4-228495 A | 8/1992 |
| JP | H04238896 | 8/1992 |
| JP | H05013342 A | 1/1993 |
| JP | H05-024985 | 2/1993 |
| JP | H06-151336 A | 5/1994 |
| JP | H061251158 | 9/1994 |
| JP | H08133893 A | 5/1996 |
| JP | H09-11146 A | 4/1997 |
| JP | H09-111461 A | 4/1997 |
| JP | H11273895 A | 10/1999 |
| JP | 2001007385 | 1/2001 |
| JP | 2002265296 A | 3/2001 |
| JP | 2001-148376 A | 5/2001 |
| JP | 2001-244256 A | 9/2001 |
| JP | 2003045810 A | 2/2003 |
| JP | 2003-142471 A | 5/2003 |
| JP | 2004235434 A | 8/2004 |
| JP | 2004244298 A | 9/2004 |
| JP | 2005-033167 A | 2/2005 |
| JP | 2005-044822 A | 2/2005 |
| JP | 2005041718 A | 2/2005 |
| JP | 2005512928 A | 5/2005 |
| JP | 2006-120853 A | 5/2006 |
| JP | 2007031792 A | 2/2007 |
| JP | 2007142195 | 6/2007 |
| JP | 2007191356 A | 8/2007 |
| JP | 2007273913 A | 10/2007 |
| JP | 2007284773 A | 11/2007 |
| JP | 2007331955 A | 12/2007 |

(56) References Cited

FOREIGN PATENT DOCUMENTS

| | | |
|---|---|---|
| JP | 2006286269 A | 5/2008 |
| JP | 2009280421 A | 12/2009 |
| KR | 20020061768 A | 7/2002 |
| RU | 2315826 | 6/2005 |
| SE | 500740 C2 | 8/1994 |
| WO | 98/33362 A1 | 7/1998 |
| WO | 02/077319 A1 | 10/2002 |
| WO | 03/040440 A2 | 5/2003 |
| WO | 03/052174 A2 | 6/2003 |
| WO | 03052174 A2 | 6/2003 |
| WO | 2006/020424 A2 | 2/2006 |
| WO | 2006/117621 | 11/2006 |
| WO | 2006/127611 A2 | 11/2006 |
| WO | 2007/092893 A2 | 8/2007 |
| WO | 2008/025899 | 3/2008 |
| WO | 2008/029258 | 3/2008 |
| WO | 2008/090510 | 7/2008 |
| WO | 2008/123605 A1 | 10/2008 |
| WO | WO 2008123605 A1 * | 10/2008 |
| WO | 2010/004836 A1 | 1/2010 |
| WO | 2010/021382 A1 | 2/2010 |
| WO | 2010/084655 | 7/2010 |

OTHER PUBLICATIONS

Balmer et al., Chemical vapour deposition synthetic diamond: materials, technology and applications, Journal of Physics: Condensed Matter, 21, 2009.
Whitfield et al., Nucleation and growth of diamond films on single crystal and polycrystalline tungsten substrates, Diamond and Related Materials, vol. 9, pp. 262-268, 2000.
International Search Report issued on PCT/EP2011/072824, dated May 3, 2012.
Silva et al., Microwave Analysis of PACVD diamond deposition reactor based on electromagnetic materials, Diamond & Related Materials, vol. 19, pp. 397-403, 2010.
Search Report issued on GB1121517.5, dated Mar. 27, 2012.
Funer et al., Simulation and development of optimized microwave plasma reactors for diamond deposition, Surface and Coatings Technology, 1999, 853-862, vol. 116-119.
Hassouni et al., Self-consistent microwave field and plasma discharge simulations for a moderate pressure hydrogen discharge reactor, Journal of Applied Physics, 1999, pp. 134-151, 86(1).
Search Report issued on GB1021913.7, dated Apr. 21, 2011.
Kosky et al., Fracture-free release of CVD diamond, Diamond and Related Materials 5 (1996) pp. 1313-1317.
Asmussen, et al., Multiple substrate microwave plasma-assisted chemical vapor deposition single crystal diamond syntheses, Applied Physics Letters, p. 93, 031502, 2008.
Chae, et al., The 8-inch free-standing CVD diamond wafer fabricated by DC-PACVD, Diamond and Related Materials, 19, 2010, pp. 1168-1171.
Gray, et al., Free-standing CVD diamond wafers for thermal management by d.c. arc jet technology, Diamond and Related Materials 8, 1999, 903-908.
Liao, Samuel Y., Microwave Devices and Circuits, 3d Edition, published by Prentice-Hall, Inc., New Jersey pp. 144-156.
Hassouni et la., Modelling of diamond deposition microwave cavity generated plasmas, J. Phys. D. Appl. Phys,. 43 (2010) 153001.
Hemawan, et a., Improved microwave plasma cavity reactor for diamond synthesis at high-pressure and high power density, Diamond & Related Materials 19 (2010) 1446-1452.
Alam et al., Adhesion of diamond coatings on tungsten substrates, Journal of Adhesion Science and Technology, vol. 9, No. 6, 1995 Netherlands, 653-679.
Feng, et al., Surface stress measurement with interference microscopy of thick homoepitaxial single-crystal diamond layers, Diamond & Related Materials 19 (2010) 1453-1456.
Yamada, Simulation with an improved plasma model utilized to design a new structure of microwave plasma dischage for chemical vapor deposition of diamond crystals, Diamond and Related Materials, 17, Issues 4-5 (2008), pp. 494-497.
Achard, J., et al., Thick boron doped diamond single crystals for high power electronics, Diamond & Related Materials, 20, pp. 145-152, 2010.
Lee, et al., Single-cathode DC PACVD process for large-area CVD diamond wafer fabrication, 203rd Meeting of the Electrochemical Society, Eighth International Symposium on Diamond Materials, 2003.
Funer et al., Numerical simulations of microwave plasma reactor for diamond CVD, Surface and Coatings Technology, 74-75 (1995), pp. 221-226.
International Search Report issued on PCT/EP2011/072820, dated Mar. 30, 2012.
Search Report issued on GB1121474.9, dated Mar. 27, 2012.
Search Report issued on GB1305030.7 dated Apr. 16, 2013.
Search Report issued on GB1305041.4 dated Apr. 15, 2013.
Search Report issued on GB1305045.5 dated Apr. 16, 2013.
Search Report issued on GB1121486.3 dated Apr. 12, 2012.
Search Report issued on GB1021870.9 dated Apr. 6, 2011.
Search Report issued on GB1021865.9 dated Apr. 20, 2011.
Search Report issued on GB1121494.7 dated Apr. 7, 2012.
Search Report issued on GB1021860.0 dated Apr. 20, 2011.
Search Report issued on GB1121492.1 dated Apr. 12, 2012.
Search Report issued on GB1121855.0 dated May 31, 2011.
Search Report issued on GB1121499.6 dated Jan. 27, 2012.
Search Report issued on GB1121505.0 dated Mar. 29, 2012.
International Search Report issued on PCT/EP2011/072825 dated Mar. 30, 2012.
Search Report issued on GB1021853.5 dated Mar. 30, 2011.
International Search Report issued on PCT/EP2011/072823, dated Jul. 4, 2012.
International Search Report issued on PCT/EP2011/072822, dated May 23, 2012.
International Search Report issued on PCT/EP2011/072818, dated Jun. 22, 2012.
International Search Report issued on PCT/EP2011/072821, dated Mar. 2, 2012.
Silva, F., et al., Microwave engineering of plasma-assisted CVD reactors for diamond deposition, Journal of Physics; Condensed Matter, vol. 21, No. 364202, 2009.
Popov, "High density Plasma sources: design, physics and performance", Noyes publications, 1996, pp. 258-295.
Nagatsu et al., "Plasma reactor with two-microwave oscillators for diamond film synthesis", Thin Solid Films, Science Direct, 2006 pp. 617-621.
Japanese Patent Application No. 2014-248072, Office Action mailed Oct. 28, 2015, 10 pages.

* cited by examiner

METHODS OF MANUFACTURING SYNTHETIC DIAMOND MATERIAL BY MICROWAVE PLASMA ENHANCED CHEMICAL VAPOR DEPOSITION FROM A MICROWAVE GENERATOR AND GAS INLET(S) DISPOSED OPPOSITE THE GROWTH SURFACE AREA

FIELD OF INVENTION

The present invention relates to a method of controlling the concentration and uniformity of dopants in synthetic diamond material manufactured using a chemical vapour deposition (CVD) technique.

BACKGROUND OF INVENTION

CVD processes for manufacture of synthetic diamond material are now well known in the art. Useful background information relating to the chemical vapour deposition of diamond materials may be found in a special issue of the Journal of Physics: Condensed Matter, Vol. 21, No. 36 (2009) which is dedicated to diamond related technology. For example, the review article by R. S Balmer et al. gives a comprehensive overview of CVD diamond materials, technology and applications (see "Chemical vapour deposition synthetic diamond: materials, technology and applications" J. Phys.: Condensed Matter, Vol. 21, No. 36 (2009) 364221).

Being in the region where diamond is metastable compared to graphite, synthesis of diamond under CVD conditions is driven by surface kinetics and not bulk thermodynamics. Diamond synthesis by CVD is normally performed using a small fraction of carbon (typically <5%), typically in the form of methane although other carbon containing gases may be utilized, in an excess of molecular hydrogen. If molecular hydrogen is heated to temperatures in excess of 2000 K, there is a significant dissociation to atomic hydrogen. In the presence of a suitable substrate material, diamond can be deposited.

Atomic hydrogen is believed to be essential to the process because it selectively etches off non-diamond carbon from the substrate such that diamond growth can occur. Various methods are available for heating carbon containing gas species and molecular hydrogen in order to generate the reactive carbon containing radicals and atomic hydrogen required for CVD diamond growth including arc-jet, hot filament, DC arc, oxy-acetylene flame, and microwave plasma.

Methods that involve electrodes, such as DC arc plasmas, can have disadvantages due to electrode erosion and incorporation of material into the diamond. Combustion methods avoid the electrode erosion problem but are reliant on relatively expensive feed gases that must be purified to levels consistent with high quality diamond growth. Also the temperature of the flame, even when combusting oxy-acetylene mixes, is insufficient to achieve a substantial fraction of atomic hydrogen in the gas stream and the methods rely on concentrating the flux of gas in a localized area to achieve reasonable growth rates. Perhaps the principal reason why combustion is not widely used for bulk diamond growth is the cost in terms of kWh of energy that can be extracted. Compared to electricity, high purity acetylene and oxygen are an expensive way to generate heat. Hot filament reactors while appearing superficially simple have the disadvantage of being restricted to use at lower gas pressures which are required to ensure relatively effective transport of their limited quantities of atomic hydrogen to a growth surface.

In light of the above, it has been found that microwave plasma is the most effective method for driving CVD diamond deposition in terms of the combination of power efficiency, growth rate, growth area, and purity of product which is obtainable.

A microwave plasma activated CVD diamond synthesis system typically comprises a plasma reactor vessel coupled both to a supply of source gases and to a microwave power source. The plasma reactor vessel is configured to form a resonance cavity supporting a standing microwave. Source gases including a carbon source and molecular hydrogen are fed into the plasma reactor vessel and can be activated by the standing microwave to form a plasma in high field regions. If a suitable substrate is provided in close proximity to the plasma, reactive carbon containing radicals can diffuse from the plasma to the substrate and be deposited thereon. Atomic hydrogen can also diffuse from the plasma to the substrate and selectively etch off non-diamond carbon from the substrate such that diamond growth can occur.

A range of possible microwave plasma reactors for diamond film growth via a chemical vapour deposition (CVD) process are known in the art. Such reactors have a variety of different designs. Common features include: a plasma chamber; a substrate holder disposed in the plasma chamber; a microwave generator for forming the plasma; a coupling configuration for feeding microwaves from the microwave generator into the plasma chamber; a gas flow system for feeding process gases into the plasma chamber and removing them therefrom; and a temperature control system for controlling the temperature of a substrate on the substrate holder.

A useful overview article by Silva et al. (Paris University's LIMHP group) summarizing various possible reactor designs is given in the previous mentioned Journal of Physics (see "Microwave engineering of plasma-assisted CVD reactors for diamond deposition" J. Phys.: Condensed Matter, Vol. 21, No. 36 (2009) 364202). Having regard to the patent literature, U.S. Pat. No. 6,645,343, EP0480581 and US2010/0189924 disclose various reactor designs including systems in which process gas is injected into the plasma chamber at high velocity to establish convective transfer of activated gas species from the plasma to the substrate in order to increase growth rate of a CVD diamond film and/or improve thickness uniformity of the CVD diamond film.

Doping of synthetic diamond material during CVD synthesis is also known in the art. Common dopants in diamond material which may have some desirable use include boron, nitrogen, silicon, sulphur, phosphorous, lithium and beryllium. Synthetic boron doped diamond material is of particular interest as boron doping can, for example, make the synthetic diamond material semi-conductive or, at high doping levels, full metallic conduction can be achieved. Synthetic boron doped diamond material finds applications that range from mechanical applications to electronics and sensors.

There is a need to grow synthetic diamond material which contains a uniform concentration of dopant to maintain consistency of product. For example, in boron doped polycrystalline diamond it is desirable to grow large area (e.g. greater than 120 mm diameter), thick (e.g. great than 0.5 mm), free-standing polycrystalline diamond wafers which can be processed using electric discharge machining (EDM) methods. In order to achieve this, the boron concentration needs to be high enough to ensure a reasonable and viable cutting rate, but not so high that it begins to degrade the material properties. Furthermore, the boron concentration must be within these limits over the majority volume of the disk.

A similar argument applies to single crystals, for example wherein a plurality of single crystals might be homoepitaxially grown in a single growth run. Specifications on the boron set by applications that include electronics require all of these single crystal diamonds to contain similar boron concentrations.

There is also a need in some methods (particularly in single crystal {100} oriented growth) to find routes to achieve higher boron concentrations necessary for example, for metallic conduction.

A significant amount of work has been performed in this field in relation to boron doped polycrystalline and single crystal diamond material. For example, EP 0 822 269 B1 discloses the basic CVD chemistry required for achieving boron doping. EP1463849 teaches how to achieve uniform boron doping over a single crystal of synthetic CVD diamond material by utilizing a diamond substrate having a surface substantially free of crystal defects.

J. Achard, F. Silva et al. also discuss boron doping of CVD diamond material using a reactor as described in the previous discussed Silva et al. paper (see "Thick boron doped diamond single crystals for high power electronics", Diamond & Related Materials (2010), doi: 10.1016/j.diamond.2010.11.014). Here, the effect of boron concentration in the reaction gases and microwave power density is discussed in relation to boron doping of single crystal CVD diamond material. It is described that in order to increase the level of boron incorporation into a single crystal CVD diamond film it is necessary to increase the amount of diborane added to the reaction gases but for $[B]/[C]_{gas}$ ratios above 5000 ppm the plasma is unstable due to formation of soot that accumulates and prevents deposition longer than a couple of hours, and thus prevents the growth of thick films. It is also described that high microwave power densities are desirable for rapid growth of CVD diamond films but that higher microwave power densities result in lower boron incorporation. As such, it is concluded that a compromise must be reached by using a mid-range microwave power density (specifically disclosed as 60 $Wcm^{-3}$) and a $[B]/[C]_{gas}$ ratio of 5000 ppm to grow a 300 µm-thick heavily boron-doped film ($10^{20}$ $cm^{-3}$) from which a freestanding plate can be formed.

It is an aim of certain embodiments of the present invention to provide a method and apparatus which is capable of achieving more uniform doping of CVD diamond material over large areas of, for example, polycrystalline diamond material and/or over a large number of single crystal diamonds grown in a single growth run. It is also an aim of certain embodiments to achieve higher levels of doping such as high boron doping concentrations for electronic and sensor applications. It is a further aim to achieve uniform and/or higher levels of doping while simultaneously achieving good growth rates given that some dopants such as boron have a tendency to reduce growth rates.

SUMMARY OF INVENTION

While it was previously known that growth rate and thickness uniformity of a synthetic CVD diamond film are sensitive to gas flow rate and geometry, the present inventors have now surprisingly found that incorporation of dopants is also very sensitive to gas flow rate and geometry of gas flow. In particular, it has been found that it is advantageous to:

select a microwave plasma reactor configured to inject process gases towards a growth surface of a substrate (i.e. a gas flow configuration which is oriented axially with respect to the plasma chamber so that process gases are injected directly towards the substrate); operate the configuration at high velocity gas flow; and introduce a dopant such as boron into the process gases at a suitable concentration. It has been found that this combination of features enables uniform doping to be achieved over larger areas of polycrystalline diamond material and/or over a larger number of single crystal diamonds grown in a single growth run and/or for achieving very high levels of doping such as high boron doping concentrations in synthetic single crystal CVD diamond material while maintaining good growth rates and good material quality. For example, following the teachings of J. Achard, F. Silva et al. the present inventors consider that it is not possible to achieve boron incorporation into certain synthetic single crystal CVD diamond materials, e.g. {100} oriented synthetic single crystal CVD diamond materials, significantly over $10^{20}$ $cm^{-3}$. In contrast, by using an axially oriented gas flow arrangement and operating at high velocity gas flow it has been possible to significantly exceed $10^{20}$ $cm^{-3}$ boron concentrations and access the metallic conduction regime in high quality single crystal CVD diamond material produced using a microwave plasma activated CVD technique. Previously, while such levels of boron incorporation were possible in thin, lower quality single crystal films and polycrystalline diamond material, such a high level of boron incorporation into high quality single crystal CVD diamond material formed using a microwave plasma, particularly using a substrate having a desirable crystallographic orientation for high quality single crystal CVD diamond growth, was not achievable. In addition, using an axially oriented gas flow arrangement and operating at high velocity gas flow, particularly when using multiple inlet nozzles, it is possible to uniformly incorporate boron into both single crystal and polycrystalline synthetic CVD diamond material over large areas.

In light of the above, according to a first aspect of the present invention there is provided a method of manufacturing synthetic CVD diamond material, the method comprising:

providing a microwave plasma reactor comprising:
  a plasma chamber;
  one or more substrates disposed in the plasma chamber providing a growth surface area over which the synthetic CVD diamond material is to be deposited in use;
  a microwave coupling configuration for feeding microwaves from a microwave generator into the plasma chamber; and
  a gas flow system for feeding process gases into the plasma chamber and removing them therefrom,
injecting process gases into the plasma chamber;
feeding microwaves from the microwave generator into the plasma chamber through the microwave coupling configuration to form a plasma above the growth surface area; and
growing synthetic CVD diamond material over the growth surface area,
wherein the process gases comprise at least one dopant in gaseous form, selected from a one or more of boron, silicon, sulphur, phosphorous, lithium and beryllium, the or each dopant present at a concentration equal to or greater than 0.01 ppm, and/or a nitrogen dopant at a concentration equal to or greater than 0.3 ppm, wherein the gas flow system includes a gas inlet comprising one or more gas inlet nozzles disposed opposite the growth surface area and configured to inject process gases towards the growth surface area, and wherein the process gases are injected towards the growth surface area at a total gas flow rate equal to or greater than 500 standard $cm^3$ per minute and/or wherein the process gases are injected into the plasma chamber through the or each gas inlet nozzle with a Reynolds number in a range 1 to 100.

The aforementioned method may be utilized to grow a large synthetic polycrystalline CVD diamond wafer having a substantially uniform concentration of dopant throughout the wafer or for growing a larger number of single crystal diamonds grown in a single growth run, the plurality of single crystal diamonds having substantially the same dopant concentration. Further still, the method can be utilized to achieving very high levels of doping (e.g. equal to or greater than $2 \times 10^{20}$ $cm^{-3}$) while maintaining good growth rates and good material quality. When uniform doping over large areas is desired, the provision of multiple gas inlet nozzles is preferred. However, when a high level of doping over a relatively small area is required a single gas inlet nozzle may be utilized.

According to a second aspect of the present invention there is provided a synthetic polycrystalline CVD diamond wafer, said wafer having a longest dimension equal to or greater than 140 mm and comprising at least one dopant having a concentration which varies by no more than 50% of a mean concentration over at least 70% of the volume of the synthetic polycrystalline CVD diamond wafer.

According to a third aspect of the present invention there is provided a layer of synthetic single crystal CVD diamond material, said layer having a thickness greater than 50 µm and comprising boron dopant having a concentration equal to or greater than $2 \times 10^{20}$ $cm^{-3}$.

According to a fourth aspect of the present invention there is provided a synthetic single crystal CVD diamond comprising a doped layer and an adjacent undoped layer, wherein an interface between the doped and undoped layer is substantially free of impurities and wherein the dopant concentration varies by at least a factor of 3 over a thickness of no more than 10 µm across the interface between the doped and undoped layers.

Embodiments of the present invention use gas flow to control incorporation of dopants such as nitrogen, boron, silicon, phosphorous, lithium and beryllium. Embodiments may also control the concentration and distribution of other defects such as dangling bonds and vacancy clusters. Particularly useful embodiments use gas flow to control the concentration and distribution of boron in synthetic CVD diamond material to meet the needs previously described in the background section of this specification. For example: free-standing polycrystalline diamond wafers which can be reliably and consistently processed using electric discharge machining (EDM) methods, e.g. to form mechanical tool and wear parts; free-standing polycrystalline diamond wafers with consistent and uniform conduction characteristics for use as electrodes, e.g. in water treatment and ozone generation applications; highly boron doped, uniform, high quality single crystal diamond components for use in sensing and electronic applications, e.g. electrochemical sensing applications which require very high boron concentrations and electronic components such as diamond diode and transistor structures; gems having a reliable, uniform, consistent, and reproducible colour, e.g. blue boron doped gems and colourless or near colourless gems formed by co-doping using boron and another dopant such as nitrogen; and quantum grade synthetic diamond material comprising a uniform distribution of nitrogen dopant in the form of nitrogen-vacancy ($NV^-$) defects. Further embodiments enable the formation of doped layers which have high purity, well defined interfaces with adjacent undoped layers within a synthetic single crystal CVD diamond.

BRIEF DESCRIPTION OF THE DRAWINGS

For a better understanding of the present invention and to show how the same may be carried into effect, embodiments of the present invention will now be described by way of example only with reference to the accompanying drawings, in which.

DETAILED DESCRIPTION OF CERTAIN EMBODIMENTS

Reactor Hardware and Gas Inlet Configurations

Figure 1:
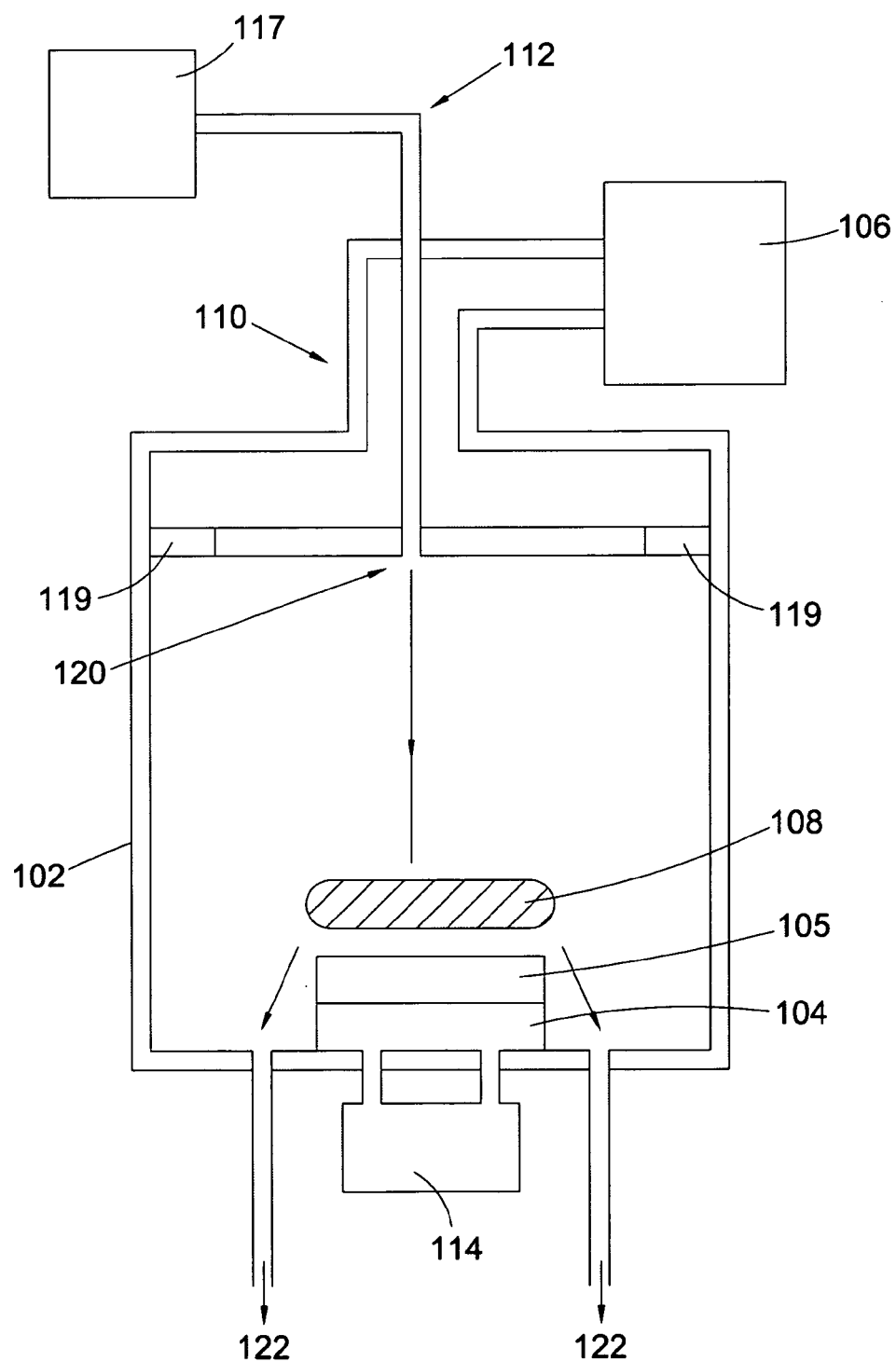
FIG. 1 shows a cross-sectional view of a microwave plasma reactor configured to deposit a synthetic CVD diamond film using a single axially disposed gas inlet nozzle arranged to inject process gases towards a growth surface of a substrate.

FIG. 1 shows a cross-sectional view of a microwave plasma reactor configured to deposit a synthetic CVD diamond film using a single axially disposed gas inlet nozzle arranged to inject process gases towards a growth surface of a substrate as a directed jet of high velocity process gas.

The microwave plasma reactor comprises the following basic components: a plasma chamber 102; a substrate holder 104 disposed in the plasma chamber for holding a substrate 105; a microwave generator 106 for forming a plasma 108 within the plasma chamber 102; a microwave coupling configuration 110 for feeding microwaves from the microwave generator 106 into the plasma chamber 102 via a coaxial waveguide and through an annular dielectric window 119; a gas flow system 112, 122 for feeding process gases into the plasma chamber 102 and removing them therefrom; and a substrate coolant system 114 for controlling the temperature of a substrate 105.

The plasma chamber 102 may have a number of different configurations suitable for supporting a standing microwave. However, it is found that this invention is best utilized in conjunction with simple modal synthesis chambers, for instance the $TM_{011}$ mode is advantageous as it has been found to be the most compact (small) mode which can be practicably used in a diamond CVD plasma reactor. Its compactness means that the impact of gas flow aspects on the near gas phase chemistry are maximized, however, this invention is not limited to this modal geometry. The use of a small plasma chamber having a compact microwave cavity is made possible by the flow characteristics of the gas inlet according to embodiments of the present invention which ensures that process gas flows through a central portion of the plasma chamber without undue circulation of gases within the plasma chamber contaminating walls of the chamber which will be relatively close to the gas flow in a compact cavity arrangement.

The gas flow system 112 comprises source gas containers 117 and a gas inlet coupled to the source gas containers and positioned in a top portion of the plasma chamber 102 axially disposed above the substrate holder 104 and substrate 105 for directing process gases towards the substrate 105 in use. In the illustrated embodiment the process gas is fed from the source gas containers 117 to the gas inlet through a central conductor of the microwave coupling configuration 110. However, other configurations are also possible for feeding the process gases to the gas inlet 120.

The microwave window 119 for feeding microwaves from the microwave generator into the plasma chamber is preferably disposed at an opposite end of the plasma chamber to the substrate holder. Furthermore, the gas inlet is preferably disposed closer to the substrate holder than the microwave window. Such an arrangement can minimize the possibility of the microwave window being contaminated with process gases while also ensuring that the process gas is injected at a location relatively close to the substrate.

In the arrangement shown in FIG. 1, the gas inlet comprises a single gas injection nozzle located on a central rotational axis of the plasma chamber so as to direct a jet of process gas in an axial direction towards the substrate holder. The gas injection nozzle may be formed by a portion of the microwave/vacuum wall such that the nozzle form part of the microwave cavity wall of the plasma chamber, rather than being outside the mesh that defines the microwave cavity wall.

One or more gas outlets 122 are provided in a base of the plasma chamber 102. The gas outlets 122 are preferably located in a ring around the substrate holder 104 and most preferably form a uniformly spaced array around the substrate holder 104 to enhance continuous gas flow from the gas inlet 120 towards the substrate 105, around the substrate 105, and out of the gas outlets 122 while minimizing turbulence and gas recirculation back up the plasma chamber 102. For example, it may be preferable to provide at least 6, 12, 18, or 30 gas outlets disposed around the substrate holder 104, preferably in a uniformly spaced array. In this regard, it should be noted that while embodiments of the present invention may function to reduce uncontrolled gas re-circulation within the plasma chamber, this does not preclude the possibility of using a controlled gas re-circulation system outside the plasma chamber for re-using process gas which is extracted from the plasma chamber through the gas outlets.

Figure 2:
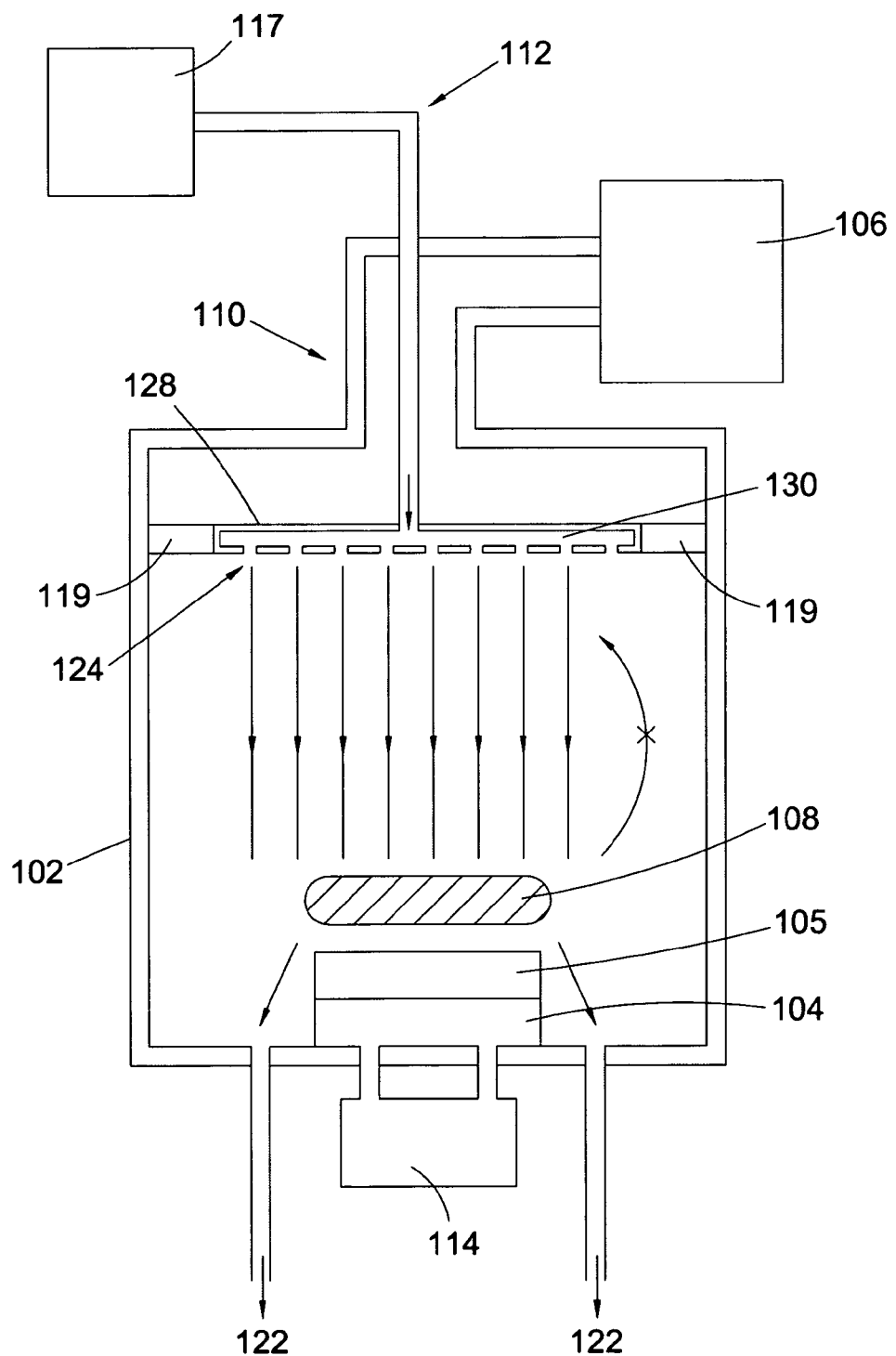
FIG. 2 shows a cross-sectional view of a microwave plasma reactor configured to deposit a synthetic CVD diamond film using a plurality of gas inlet nozzles arranged to inject process gases towards a growth surface of a substrate.

FIG. 2 shows a similar microwave plasma reactor to that shown in FIG. 1. The arrangement shown in FIG. 2 differs in that the gas inlet comprises a plurality of gas inlet nozzles arranged in a gas inlet nozzle array 124 to inject process gases towards a growth surface of a substrate in an axial direction. In other respects like reference numerals are used for like parts.

The gas inlet nozzle array 124 comprises a plurality of gas inlet nozzles disposed opposite the substrate holder 104 for directing process gases towards the substrate holder 104. The gas inlet nozzle array 124 comprises a plurality of gas inlet nozzles disposed in a substantially parallel orientation relative to the central axis of the plasma chamber 102. The gas inlet array 124 also comprises a housing 128 defining a cavity 130 for receiving process gases from one or more gas inlet pipes. The housing 128 also defines the plurality of inlet nozzles for injecting process gases from the cavity 130 into the plasma chamber 102 and towards the substrate holder 104. For example, the housing may comprise metallic walls in which the inlet nozzles are integrally formed.

The housing 128 and cavity 130 can function as a mixing chamber for mixing source gases prior to injection into the plasma chamber. Such a pre-mixing chamber has found to be useful to ensure efficient gas mixing prior to injection into the plasma chamber. Furthermore, a pre-mixing chamber is useful to ensure that there is a uniform gas flow over the entirety of the array of gas nozzles. The pre-mixing chamber may include a diffuser or an array of holes disposed prior to the gas inlet nozzle array to encourage gas mixing and/or provide an even flow of gas to the gas inlet nozzle array.

The housing 128 can also extend into the plasma chamber allowing gases to be injected closer to the substrate. The distance between the gas inlet nozzle array and the substrate where diamond growth occurs affects the thickness of a boundary layer over the substrate. Reducing the distance between the gas inlet nozzle array and the substrate had been found to reduce the thickness of such a boundary layer and lead to an increase in diamond deposition rate.

The present inventors have found that in contrast to the teachings of US2010/0189924, it is advantageous to provide a gas inlet configuration in which gas inlet nozzles are not angled inwardly to interact above the substrate and constrain the plasma in a lateral direction. Furthermore, US2010/0189924 discloses a relatively small number of gas inlets. One problem with providing a single axially positioned gas inlet arrangement or one which uses a relatively small number of gas inlets is that at very high velocity flows, the gas stream can penetrate through the plasma, essentially punching a hole in the plasma discharge and pushing the plasma outwards towards the sides of the substrate, leading to non-uniform diamond film formation. The present inventors have found that instead of providing a relatively small number of gas inlet nozzles, problems associated with the process gas stream punching-through a central region of the plasma discharge at very high gas stream velocities can be reduced by providing a higher number of inlet nozzles. The inlet nozzles may be oriented so as to be substantially parallel or divergent in orientation.

In addition, it has been found that the relatively high number of nozzles may be closely spaced to ensure a relatively uniform flow of gas. It has been found that providing a relatively high number density of nozzles in an array improves the uniformity of gas flow towards the substrate in use and allows the plasma to be uniformly flattened and shaped relative to the substrate to achieve uniform diamond film formation at high rates over a relatively large area.

It has also been found to be useful to provide relatively small area nozzles such that the area of the nozzle array is largely made up of the space in-between the nozzles rather than the area of the nozzle outlets themselves. As such, whereas it has been found to be advantageous to provide a relatively large number density of nozzles in relation to the area of the nozzle inlet array, it has also been found to be advantageous to provide an array in which the ratio of the area of the nozzle inlets divided by the area of the nozzle array as a whole is low. It has been found that small nozzles are advantageous for providing high velocity directed gas flows. However, it is also desired to have a relatively uniform gas flow over a relatively large area for uniform deposition of a diamond film over a relatively large area. Accordingly, a combination of relatively small inlet nozzle size and a relatively high number density of such nozzles has been found to be advantageous to achieve a balance between high velocity directed gas flows and uniformity of gas flow over a relatively large area.

In light of the above findings, it has been found to be advantageous to provide a gas inlet nozzle array comprising at least six gas inlet nozzles disposed in a substantially parallel or divergent orientation relative to a central axis of the plasma chamber (by substantially parallel we mean at least within 10°, 5°, 2°, or 1° of a perfect parallel arrangement). Preferably, the gas inlet nozzle array comprises a gas inlet nozzle number density equal to or greater than 0.1 nozzles/cm$^2$, wherein the gas inlet nozzle number density is measured by projecting the nozzles onto a plane whose normal lies parallel to the central axis of the plasma chamber and measuring the gas inlet number density on said plane. Furthermore, the gas inlet nozzle array may comprise a nozzle area ratio of equal to or greater than 10, wherein the nozzle area ratio is measured by projecting the nozzles onto a plane whose normal lies parallel to the central axis of the plasma chamber, measuring the total area of the gas inlet nozzle area on said plane, dividing by the total number of nozzles to give an area associated with each nozzle, and dividing the area associated with each nozzle by an actual area of each nozzle.

The aforementioned arrangements capture four features which are advantageously provided: (i) a relatively high number of gas inlet nozzles (in the most simple embodiment, six nozzles arranged in a hexagonal arrangement, but preferably many more nozzles are provided for certain applications); (ii) the orientation of the nozzles may be substantially parallel or divergent; (iii) the gas inlet nozzle number density may be high (at least 0.1 nozzles/cm$^2$ but preferably much higher for certain applications); and (iv) the ratio of the area associated with each nozzle relative to the actual area of each nozzle should be high (at least 10 but preferably much higher for certain applications).

It has been found that a gas inlet nozzle array comprising these four characteristics can be utilized to form a relatively solid curtain of process gas flowing towards the substrate. By "solid" we mean that the plurality of individual gas streams are so densely packed that they may be approximated to a single uniform mass of gas flowing towards the substrate. The solid gas stream may comprise a dense curtain of individual gas flows or an essentially continuous (in a radial direction) uniform flow of process gas. The nozzles may be configured such that individual gas streams are aimed at the substrate but do not significantly interact with each other before the substrate to cause unwanted turbulence. While the individual gas streams may merge to form a single "plug" of gas flowing towards the substrate, the streams are not configured to significantly cross each other above the substrate. This is advantageous to provide good gas flow characteristics creating a more laminar flow of the gas streams and preventing or at least reducing turbulence.

Such an arrangement can provide a relatively uniform flow of gas over a relatively large area. Furthermore, such an arrangement can reduce gas entrainment such that the majority, or preferably substantially all, the gas flows in a direction towards the substrate and out of outlets in a base of the chamber with reduced, or preferably substantially no, gas re-circulating within the chamber. It has been found that by preventing gas entrainment, the concentration of species in the activated plasma region is more controllable by direct control of the concentration of gases injected through the inlet nozzles. Furthermore, by limiting the possibility of gases re-circulating within the plasma chamber, it is possible to minimize the possibility of contaminating the walls of the chamber even when relatively large area plasmas are formed. That is, a high density of closely spaced high velocity gas streams functions both to prevent any gas flowing back towards the inlet nozzles via convection and can also provide a relatively even distribution of pressure on the plasma discharge to flatten it in an even manner and allow the possibility for very large area, flat, even plasmas to be achievable at very high flow rates.

For example, for flat substrate configurations it is has been found to be advantageous to provide a gas inlet configuration comprising a high density of inlet nozzles which are oriented in a direction substantially perpendicular to the substrate so as to provide a substantially uniform curtain of gas propagating towards the substrate and impinging upon the plasma discharge disposed between the gas inlet and the substrate. Such an arrangement has been found to flatten the plasma discharge and increase the concentration of activated gas species in close proximity to the substrate surface. Furthermore, the substantially uniform curtain of gas formed by a high density of the nozzles has been found to provide a substantially uniform deposition of reactive gas species from the plasma to the substrate via convection transport over large areas without unduly constricting the plasma in a lateral direction by angling the inlet nozzles inwardly as is suggested in US2010/0189924.

In some arrangements, it has actually been found to be advantageous to angle at least some of the gas inlet nozzles outwardly in a divergent configuration to achieve more uniform diamond film formation. For example, one central nozzle and six surrounding nozzles which are oriented to form divergent gas streams. This arrangement has been found to be particularly useful when a non-planar substrate is utilized. In one arrangement, a convex substrate is provided with a central portion which is closer to the gas inlet arrangement than side edge portions. The divergent nozzles are then useful to aid in pushing the plasma around towards the side edge portions of the substrate to achieve relatively uniform diamond film formation over the convex substrate. Such an arrangement is useful for forming non-planar diamond films.

While the aforementioned description specifies that at least six gas inlet nozzles may be provided to achieve more uniform diamond film formation over larger areas and/or over non-planar substrates, it has been found that for certain applications a much larger and more dense array of gas inlet nozzles is advantageous for many applications. For example, in certain applications it may be preferable to provide a gas inlet configuration comprising equal to or greater than 6, 7, 9, 10, 15, 20, 30, 40, 60, 90, 120, 150, 200, 300, 500, 700, 1000, 1200, 1500 or more gas inlet nozzles. Particularly preferred arrangements comprise a close-packed array of gas inlet nozzles, for example, a hexagonal close-packed array of gas inlet nozzles has been found to be particularly advantageous in achieving uniform diamond film formation over large areas and at a high rate of deposition. As such, hexagonal close-packed nozzle configurations comprising 6, 7, 19, 37, 61, 91, 127, 169, 217, 271, 331, 397, 469, 547, 631, 721, 817, 919, 1027, 1141, 1261, 1387, 1519 or more nozzles may provide preferable arrangements.

Figure 3:
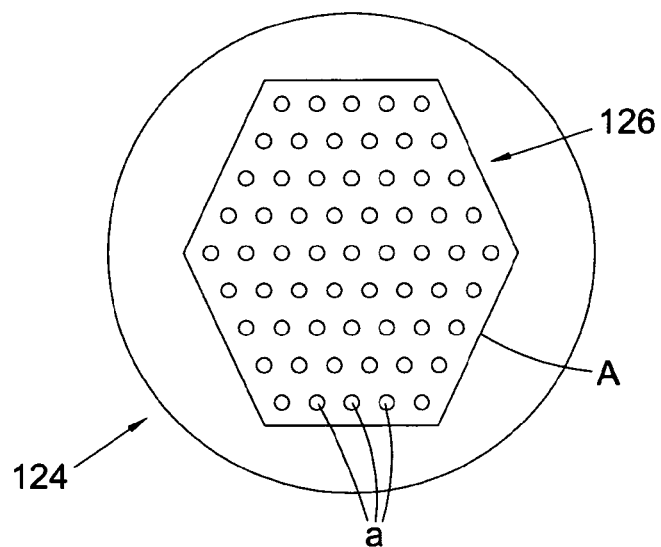
FIG. 3 shows a plan view of a gas inlet nozzle array.

FIG. 3 shows a plan view of the gas inlet nozzle array 124. The array comprises a hexagonal close-packed array of gas inlet nozzles 126. The array may comprise a gas inlet nozzle number density much greater than 0.1 nozzles/cm², wherein the gas inlet nozzle number density is measured by projecting the nozzles onto a plane whose normal lies parallel to a central axis of the plasma chamber and measuring the gas inlet number density on said plane. The gas inlet nozzle number density is measured in this way because the array may not necessarily be disposed in a plane. For example, the array may be disposed in a wall which is curved or otherwise angled relative to a plane whose normal lies parallel to a central axis of the plasma chamber. However, in the illustrated embodiment it will be noted that the array is disposed in a plane whose normal lies parallel to a central axis of the plasma chamber.

The gas inlet nozzle array 120 may have a nozzle area ratio much greater than 10, wherein the nozzle area ratio is measured by projecting the nozzles onto a plane whose normal lies parallel to a central axis of the plasma chamber, measuring the total area A of the gas inlet nozzle array on said plane, dividing by the total number of nozzles to give an area associated with each nozzle, and dividing the area associated with each nozzle by an actual area of a nozzle a. Where the nozzles have different areas, an average nozzle area can be used for the area a. If the total area A of the gas inlet array is delineated by a line passing through the centre of each of the nozzles in an outer ring of nozzles in the array, it will be noted that half the area associated with the outer ring of nozzles will be outside this area. This can be corrected for by dividing the number of nozzles in the outer ring by two when calculating the total number of nozzles and then using this corrected value in the aforementioned calculation so as to correctly calculate the area associated with each nozzle. The actual area of each nozzle may be calculated as an average nozzle area by summing the actual area of every nozzle in the array and dividing by the total number of nozzles in the array. Alternatively, if all the nozzles have the same area then the area of a single nozzle may be used for the actual area of each nozzle.

Each gas inlet nozzle 126 may have an outlet diameter in the range 0.1 mm to 5 mm, 0.2 mm to 3.0 mm, 2.0 mm to 3 mm, 0.2 mm to 2 mm, 0.25 mm to 2 mm, or 0.25 mm to 1.5 mm. The diameter of the gas inlet nozzles may be configured to achieve good laminar flow of the individual gas streams injected through and out of the nozzles into the plasma chamber 102. The dimensions of the gas inlet nozzles 126 also affect the Reynolds number $R_e$ for gas injection. The Reynolds number is a dimensionless number that gives a measure of the ratio of inertial forces to viscous forces acting in a gas stream and consequently quantifies the relative importance of these two types of forces for given flow conditions. When calculating Reynolds numbers for a nozzle, a characteristic length scale may be taken to be a cross sectional dimension of the nozzle. The Reynolds number may be used to characterize different flow regimes, such as laminar or turbulent flow. Laminar flow occurs at low Reynolds numbers, where viscous forces are dominant, and is characterized by smooth, constant fluid motion, while turbulent flow occurs at high Reynolds numbers and is dominated by inertial forces, which tend to produce chaotic eddies, vortices and other flow instabilities. In accordance with certain embodiments of the present invention it is preferable to operate at low Reynolds number to minimize turbulence. The effect of providing an array of smaller nozzles compared to a small number of larger ones is to decrease the Reynolds number (if the mean velocity of the gas stream is maintained). This reduces the "inertial" component of gas injection, in comparison to the viscous forces operating. Accordingly, it is preferred that the dimensions of the gas inlet nozzles 126 are selected to give a Reynolds number for gas injection equal to or less than 100, 80, 50, 40, or 35. Furthermore, the Reynolds number for gas injection may be equal to or greater than 1, 5, 10, 15, 20, or 25. The most preferred Reynolds number for operation will depend to some extent on the specific nozzle inlet array which is utilized.

Figure 4:
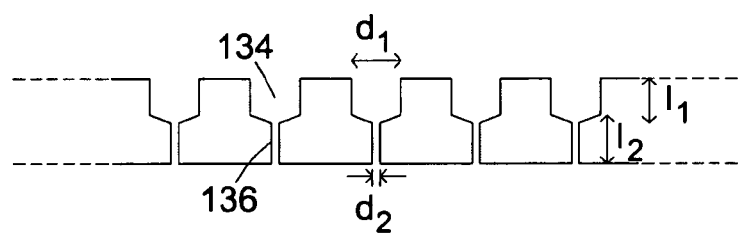
FIG. 4 shows a cross-sectional view of a portion of the gas inlet nozzle array illustrated in FIGS. 2 and 3.

FIG. 4 shows a vertical cross-sectional view of a portion of the gas inlet nozzle array 124 shown in FIGS. 2 and 3. In the illustrated arrangement, each gas inlet nozzle 126 has an inlet portion 134 having a first diameter $d_1$ and an outlet portion 136 having a second diameter $d_2$, the first diameter $d_1$ being larger than the second diameter $d_2$. Such an arrangement can be advantageous as the fine bore of the outlet portion which is advantageous for operating in a low Reynolds number regime is only required to be formed at a minimum length for achieving good gas flow characteristics. As such, for a wall thickness which is larger than a minimum length required for achieving good gas flow characteristics, the remainder of the wall thickness can be drilled out at a larger diameter. For example, the inlet portion 134 may have a length $l_1$ and the outlet portion 136 may have a length $l_2$ with the sum of $l_1$ and $l_2$ being equal to a wall thickness. Furthermore, this design aids in achieving clean laminar flow as a converging nozzle profile causes a parabolic velocity profile to develop more quickly. Of course, it is also possible to provide a gas inlet nozzle in a wall portion of the gas inlet nozzle array which consists only of a single continuous bore which may have a constant diameter along its length or a continuously varying taper.

The present invention has thus far been described with reference to an embodiment as illustrated in FIGS. 1 to 4. However, it is envisaged that various modification can be made within the scope of the invention. For example, certain embodiments of the present invention may conform to one or more general design principles for an array of gas inlet nozzles as discussed below.

Each nozzle in the array can be characterised by its lateral spacing (radius) away from a central axis of the plasma chamber. A central nozzle, if it exists, may be disposed down a central axis of the plasma chamber. Nozzles at the same radius (lying on a ring centred on the central axis) may show periodic rotational symmetry around the central nozzle, although the rotational angle may vary for different rings of nozzles.

Nozzles positioned at a particular radius from the central axis may be parallel to the central axis, or may be divergent from it. The nozzles at any particular radius may be at least as divergent as any nozzles lying on a smaller radius. That is not to say that a minority of nozzles which do not follow this principle, or even are directed at a convergent angle, are not permitted.

The nozzles may all be retained parallel to the central axis until some radius $R_p$, and then start to become divergent out to a maximum radius on which the nozzles are placed, $R_m$. In the region between $R_p$ and $R_m$, the divergence of the nozzles may vary as a function of the radius, or the angle of divergence may be fixed.

The spacing of the nozzles may be uniform across the surface through which they emerge. Preferably the nozzles are in a consistent geometric arrangement, most preferably in a hexagonal array. While not being bound by theory, it is believed that such arrangements are advantageous as the gas jets from individual nozzles converge such that their velocity profiles are well matched. This allows the gas jets to converge with little or no disturbance. Alternatively, the spacing of the nozzles may increase with radius, such that the density of nozzles reduces towards the outer edge of the array. The nozzles may be arranged in discrete rings, with little obvious correlation in the position of nozzles lying in adjacent rings. It is indeed possible to have a random array of nozzles which provides some reasonably uniform average density of nozzles to perform an adequate performance and realise some of the benefits of this invention, although the best arrangement is one of a regular array.

The diameter of each nozzle is optionally the same, particularly for large nozzle arrays (e.g. greater than 100 nozzles), or at least particularly for the majority (e.g. greater than 50% of) the nozzles in such an array.

Projecting all the nozzles onto a plane whose normal lies parallel to the central axis, the density of nozzles in the nozzle array, particularly for large nozzle arrays (e.g. greater than 100 nozzles), given in nozzles/cm$^2$, is preferably equal to or greater than 0.1, 0.2, 0.5, 1, 2, 5, or 10 and equal to or less than 100, 50, or 10.

Projecting all the nozzles onto a plane whose normal lies parallel to the central axis, the total area of the nozzles in the array (that is the sum of the areas of each nozzle outlet in the array), given in mm$^2$, may be in a range 1 to 5000, 5 to 3000, 10 to 3000, 20 to 2750, 30 to 2750, or 50 to 2700. The total area of the array over which the nozzles are spaced, given in mm$^2$, may be in a range 100 to 15000, 200 to 15000, 400 to 10000, 800 to 10000, or 1000 to 8000. The actual total area of the nozzles and the total area of the array will depend on the number of nozzles provided in the array and the area over which they are distributed, which will also be dependent on the area of CVD diamond to be grown. For example, a simple six nozzle array may have a nozzle diameter in the range 2 to 3 mm, a total nozzle area of 20 to 50 mm$^2$, and a total array area of approximately 450 mm$^2$. In contrast, a 91 nozzle array may have a nozzle diameter of approximately 0.5 mm, a total nozzle area of approximately 18 mm$^2$, and a total array area of approximately 1000 mm$^2$. Further still, a 1519 nozzle array may have a nozzle diameter in the range 0.25 to 1.5 mm, a total nozzle area of 75 to 2700 mm$^2$, and a total array area of approximately 8000 mm$^2$.

A ratio of the total nozzle area/area of the nozzle array should preferably be relatively low, for example, equal to or less than 0.5, 0.35, 0.3, 0.2, 0.1, 0.05, 0.02, 0.01, or 0.007. The ratio of the total nozzle area/area of the nozzle array may be equal to or greater than 0.001, 0.004, 0.007, 0.01, or 0.02. The actual ratio provided will depend on the number of nozzles provided in the array and the area over which CVD diamond is to be grown. For example, a simple six nozzle array may have a ratio in the range 0.05 to 0.1, a nine nozzle array may have a ratio of approximately 0.007, a 721 nozzle array may have a ratio in the range 0.004 to 0.2, and a 1519 nozzle array may have a ratio in the range 0.01 to 0.35.

A ratio of the area of the nozzle array to an array of the growth surface of the substrate may be in the range 0.05 to 2, 0.1 to 1.5, 0.5 to 1.25, 0.8 to 1.1, or 0.9 to 1.1. For arrays which comprise a large number of nozzles (e.g. greater than 100, 500, or 1000), the area of the array may be set to be substantially equal to the area of the growth surface. For arrays which have a lower number of nozzles, the area of the array is preferably less than the area of the growth surface of the substrate.

Projecting all the nozzles onto a plane whose normal lies parallel to the central axis, the total area of the nozzle array, $\pi(R_m)^2$, divided by the total number of nozzles gives the area associated with each nozzle. A ratio of the associated area of each nozzle divided by an actual area of each nozzle is preferably equal to or greater than 10, 30, 100, 300, 1000, or 3000 and equal to or less than 100000, 30000, or 10000.

Embodiments of the present invention provide inlet nozzle configurations which ensure: a relatively even flow of process gas towards the substrate thus improving diamond film uniformity; relatively little gas entrainment compared to the gas flow through the nozzles thus improving control of plasma chemistry; the possibility of plasma formation outside a region of interest near the substrate for diamond film formation is lowered; the possibility of plasma punch-through is lowered thus allowing higher velocities of gas flow and thus an increased rate of uniform diamond film formation over potentially larger areas; the nozzles are adapted to provide directed gas flow streams at high gas flow velocities and suitable operating pressures; the possibility of reactive species flowing towards the walls of the reactor by diffusion or convection is lowered thus lowering contamination during use and improving diamond film purity; and higher gas flow rates and operating pressures can be utilized without arcing occurring within the plasma chamber, enabling higher power densities to be achieved facilitating increased growth rates and improved quality of CVD diamond product.

It should be noted that while terms such as "top portion" and "base" are used in this specification when describing the plasma reactor, it is possible to invert the reactor so that in use the gas flow is in an upwards direction. As such, the terms "top portion" and "base" refer to the location of the reactor components relative to each other and not necessarily their location relative to the earth. In standard usage, the gas flow will be in a downwards direction such that the gas streams from the gas inlet nozzle array flow downwards with gravity. However, it is possible to invert the reactor such that the gas streams from the gas inlet nozzle array flow upwards against gravity. In the inverted orientation the gas flow will be parallel to principle thermally driven convection currents (which are in an upwards direction due to the large amount of heat generated in the plasma which is below the substrate in an inverted arrangement). This inverted arrangement may have some benefits for certain applications.

It should also be noted that while the microwave plasma reactor illustrated in FIGS. 1 and 2 has a separate substrate holder disposed in the plasma chamber, the substrate holder may be formed by the base of the plasma chamber. The use of the term "substrate holder" is intended to cover such variations. Furthermore, the substrate holder may comprise a flat supporting surface which is the same diameter (as illustrated) or larger than the substrate. For example, the substrate holder may form a large flat surface, formed by the chamber base or a separate component disposed over the chamber base, and the substrate may be carefully positioned on a central region of the flat supporting surface. In one arrangement, the flat supporting surface may have further elements, for example projections or grooves, to align, and optionally hold, the substrate. Alternatively, no such additional elements may be provided such that the substrate holder merely provides a flat supporting surface over which the substrate is disposed.

A variety of modifications to the gas inlet array may be envisaged. For example, the gas inlet array may be configured to transport different gas compositions though different nozzles. Furthermore, a plurality of gas inlet nozzles may have a non-uniform spacing and/or comprise non-uniform nozzle diameters. This may be advantageous as different gases will have different flow characteristics and so each of the nozzles, or a group of nozzles, can be optimized for injection of a particular source gas. In this case, the mixing cavity should be segregated to prevent mixing of source gases and configured to direct each source gas to one or more nozzles which have been specifically adapted for injecting the associated source gas. For example, one or more central nozzles may be configured to inject carbon and dopant containing gas species and optionally hydrogen gas while a plurality of outer nozzles may be configured to inject hydrogen with less or no carbon and dopant containing gas species. Such an arrangement can prevent or at least reduce contamination of the reactor walls by carbon and dopant containing species.

An alternative to the provision of a metallic housing in which the inlet nozzles are integrally formed is to form the nozzles in a microwave window which extends over a central region in an upper portion of the plasma chamber or even located closer to the substrate in a central portion of the plasma chamber. For example, the microwaves may be coupled into the chamber via a plate of microwave window material (e.g. quartz) in which the inlet nozzles are integrally formed. In such an arrangement, the high velocity laminar flow produced by a gas inlet nozzle array according to embodiments of the present invention will aid in keeping the plasma away from the microwave window. Using high gas flows will result in less contaminants being deposited near the injection nozzles and the microwave window therefore reducing the problem of contaminants falling onto the substrate and causing problems such as black spots, inclusions, and nuclei for defect formation in the CVD diamond material.

Each nozzle is preferably of a sufficiently large diameter to allow sufficient gas flow volumes at reasonable operating pressures. Accordingly, the nozzles should not be made too small and this size limitation will limit the density of nozzles which can be provided over the area of the nozzle array. Conversely, each nozzle should be made small enough to achieve a highly directed gas stream with good flow characteristics. As such, the diameter of each gas inlet nozzle is preferably in the range 0.1 mm to 5 mm, 0.2 mm to 3.0 mm, 2.0 mm to 3 mm, 0.2 mm to 2 mm, 0.25 mm to 2 mm, or 0.25 mm to 1.5 mm.

The array of nozzles is preferably formed into a surface which itself is rotationally symmetric around the central axis of the chamber. This surface may be planar, or it may curve, preferably in some smoothly varying manner. Preferably it is planar, particularly for large nozzle arrays (e.g. greater than 100 nozzles), or at least particularly for the majority (greater than 50% of) the nozzles in such an array.

The surface in which the nozzles lie is preferably reasonably close to the growth surface area, with a distance $D_c$ from the central nozzle (or where the central axis intersects the plane of the first ring of nozzles) which is less than or equal to $6R_s$, $4R_s$, or $2R_s$, where $R_s$ is the radius of the growth surface area. Preferably the central nozzle, or a plane defining the first ring of nozzles, is at least as close, or in some arrangements preferably closer, to the growth surface area as the plane defined by the next ring of nozzles out from the central axis. Optionally, the plane defining the outer ring of nozzles is also no more than $6R_s$, $4R_s$, or $2R_s$ from the growth surface area.

The arrangement of nozzles can be thought to fit into one of three example configurations as discussed below, although in practice the three example configurations all lay along a continuous spectrum of possible configurations.

A first example configuration is one which comprises at least six nozzles. The nozzles form a rotationally symmetric pattern and are either parallel to or divergent from (more particularly are divergent from) the central axis of the chamber. This configuration seeks to obtain the benefits of providing a plurality of nozzles while limiting to a relatively low number of nozzles, simplifying the fabrication of the nozzle array and simplifying use of additional elements such as interchangeable nozzle bores to vary the nozzle diameter for different applications and flow rates. The technique can achieve substantially higher uniformity in deposition than a single nozzle, particularly in relation to processes involving doping with boron.

A second example configuration comprises a central disc of nozzles which are all essentially parallel to the central axis of the plasma chamber and disposed in some regular array out to a radius $R_p$, outside of which are one or more rings of increasingly divergent nozzles to 'soften' the edge of the nozzle array. This configuration seeks to achieve a balance of the benefits from the example discussed above and the example discussed below.

A third example configuration is one in which $R_p=R_m$ and all, or substantially all, of the nozzles are parallel to the central axis. Ideally the nozzles lie in a close packed hexagonal array, and the maximum radius of the nozzle array $R_m$ meets the criteria $R_m \times F_m$ is greater than or equal to $R_s$, where $F_m$ is preferably equal to or greater than 0.5, 0.6, 0.7, 0.8, 0.9, or 1 and preferably equal to or less than 1.5, 1.3, 1.2, or 1.1. This configuration provides a dense column of flow from the surface containing the nozzles to the substrate, and which covers the entire substrate, and which permits essentially no intermixing of the existing gases in the chamber such that whilst there may be some convective currents in the peripheral regions of the chamber the substrate only sees gases which have just been injected ('fresh' gases).

The aforementioned design criteria may provide one or more advantages for certain applications as discussed below.

The position and uniformity of the plasma with respect to the substrate can easily be optimised by optimising the total flow. The solid gas stream of process gas towards the substrate can apply a substantially uniform 'pressure' across the plasma region.

Due to minimal gas flow outside of the solid gas stream between the nozzle array and the substrate, wall contaminants do not enter the depositing gas stream, so that the purity of the deposited diamond is improved.

Furthermore, the solid gas stream ensures that no activated gases re-circulate within the plasma chamber and come into contact with the surface comprising the nozzles, so that this surface stays free of deposits. This avoids any risk of such deposits breaking free and being pushed onto the substrate, which can be a source of defective growth. Further still, minimizing gas re-circulation within the plasma chamber by providing a solid gas flow of densely packed gas streams enables the nozzles to be formed in a material which may be eroded by the plasma activated species, such as a quartz plate, without the plate becoming eroded or coated. Such a quartz plate providing the nozzles may also be used as the entry point into the cavity of the microwave power, with its performance undiminished by the formation of coatings. Alternatively it is advantageous for the end of the microwave cavity in which the gases are introduced through the nozzles to be proximal to the region where the microwaves are introduced, with the substrate in the distal region of the cavity.

Process Gas Composition and Effect of Gas Flow on Dopant Uptake

By using a microwave plasma reactor comprising a gas inlet configuration as described in the previous section it is possible to achieve a high level of control in relation to the level and distribution of dopant uptake in a synthetic CVD diamond film. In order to achieve such control a dopant containing gas must be provided at a suitable concentration within the process gas fed through the gas inlet and the flow rate of the process gas must be high. As such, according to an aspect of the present invention the process gases comprise at least one dopant at a concentration equal to or greater than 0.01 ppm and the process gases are injected towards the growth surface area at a total gas flow rate equal to or greater than 500 standard $cm^3$ per minute.

The dopant may comprise one or more of nitrogen, boron, silicon, sulphur, phosphorous, lithium or beryllium provided in gaseous form. The dopant may intentionally be added into the process gas at a desired concentration and controlled to maintain the dopant at a desired level within the plasma reactor chamber. The type and concentration of dopant provided in the process gases will vary according to the desired product. For example, to achieve metallic conduction in synthetic CVD diamond material it is required to provide a high concentration of boron containing gas, such as diborane, in the process gases. In contrast, to achieve semi-conductive synthetic CVD diamond material a lower concentration of boron within the process gas is needed. Low boron concentrations can also be utilized to achieve attractive blue coloured gems. Alternatively, the concentration and distribution of nitrogen dopant may be controlled to achieve, for example, synthetic CVD diamond material suitable for quantum applications. For example, synthetic CVD diamond material having a relatively low and uniform nitrogen concentration forming $NV^-$ defects which can be optically addressed for sensing and information processing applications.

For example, at least one dopant may be provided in gaseous form into the process gases at a concentration equal to or greater than 0.01 ppm, 0.05 ppm, 0.1 ppm, 0.3 ppm, 0.5 ppm, 0.7 ppm, 1 ppm, 3 ppm, 5 ppm, 10 ppm, 20 ppm, 50 ppm, 100 ppm, 200 ppm, 300 ppm, 500 ppm, 700 ppm, or 1000 ppm. The concentration of dopant and carbon in the process gas may be such that a ratio of dopant concentration/carbon concentration is equal to or greater than $1\times10^{-6}$, $10\times10^{-6}$, $100\times10^{-6}$, or $1000\times10^{-6}$. Dopant concentrations are quoted as atomic concentrations of dopant to account for different possible molecular gas species comprising the dopant and carbon atoms, e.g. if a boron containing gas dopant species comprises two boron atoms, such as diborane, then the concentration of diborane in the process gas is multiplied by two to yield the atomic concentration of boron.

The one or more dopants may be injected into the plasma chamber in a controlled manner either separately or added to one or more source process gases prior to controlled injection into the plasma chamber.

For certain applications it may be desirable to have substantially no nitrogen dopant while in certain other applications it may be desirable to have substantially only nitrogen dopant. Accordingly, the at least one dopant may comprise: one or more of boron, silicon, sulphur, phosphorous, lithium and beryllium with the process gases comprising less than 0.3 ppm nitrogen or substantially no nitrogen other than minor background impurities, i.e. no nitrogen intentionally added; or nitrogen at a concentration of equal to or greater than 0.3 ppm with the process gases comprising less than 0.01 ppm of boron, silicon, sulphur, phosphorous, lithium and beryllium or substantially none of these dopant, i.e. only nitrogen intentionally added into the process gas as a dopant.

The total gas flow fed through the gas inlet may be equal to or greater than 500, 750, 1000, 2000, 5000, 10000, 15000, 20000, 25000, 30000, 35000, or 40000 standard $cm^3$ per minute. The total gas flow fed through the gas inlet may be equal to or less than 60000, 50000, 30000, 20000, or 10000 standard $cm^3$ per minute depending on the specific gas inlet configuration which is utilized. For example, for certain nozzle arrays a typical operating flow rate may lie in a range 500 to 40000, 1000 to 40000, or 2500 to 40000 standard $cm^3$ per minute depending on the desired growth rate, growth surface area, and target dopant concentration.

The total gas flow fed through the gas inlet is preferably equal to or greater than 3, 10, 20, 50, 100, 200, 500, or 1000 standard $cm^3$ per minute per $cm^2$ of the substrate area (i.e. growth surface area of the substrate) and equal to or less than 50000, 20000, 10000, or 5000 standard $cm^3$ per minute per $cm^2$ of the substrate area. The growth surface area may be defined as the useful deposition area, with radius $R_s$, achieved in the reactor. This may correspond to a substrate (e.g. for polycrystalline diamond growth over a single substrate) or a substrate carrier (e.g. for single crystal diamond growth where the substrate carrier comprises a plurality of individual substrates) or the diameter of a table on which individual substrates may be placed (e.g. for coating loose components).

It has been found that operating using a high velocity, axially oriented gas flow enables higher dopant uptake than previously possible. In addition, using an axially oriented gas flow arrangement and operating at high velocity gas flow, particularly when using multiple inlet nozzles, it is possible to uniformly incorporate dopants such as boron into both single crystal and polycrystalline synthetic CVD diamond material over large areas.

Optionally, the atomic partial pressure of dopant within the plasma reactor is equal to or greater than: 20 Pa, 100 Pa, 200 Pa, 400 Pa, 800 Pa, 1200 Pa or 1600 Pa at a microwave frequency in a range 2300 to 2600 MHz; 10 Pa, 50 Pa, 100 Pa, 200 Pa, 400 Pa, 600 Pa, 800 Pa, or 1000 Pa at a microwave frequency in a range 800 to 1000 MHz; 5 Pa, 25 Pa, 50 Pa, 100 Pa, 200 Pa, 300 Pa, 400 Pa, or 500 Pa at a microwave frequency in a range 400 to 500 MHz. It has been found that increasing the atomic partial pressure of dopant within the plasma reactor can lead to an increase in the concentration of dopant which is incorporated into synthetic CVD diamond material to achieve high levels of doping. Here, the partial pressure of the dopant is calculated as the partial pressure of the dopant containing gaseous species multiplied by the number of dopant atoms per molecule of the dopant containing gaseous species.

Optionally, the flow rate of carbon containing gas in the process gases is equal to or greater than 5, 10, 15, 20, 30, or 40 sccm. It has been found that increasing the flow rate of carbon containing gas increases the uptake of dopants such as boron in the solid phase.

Figure 5:
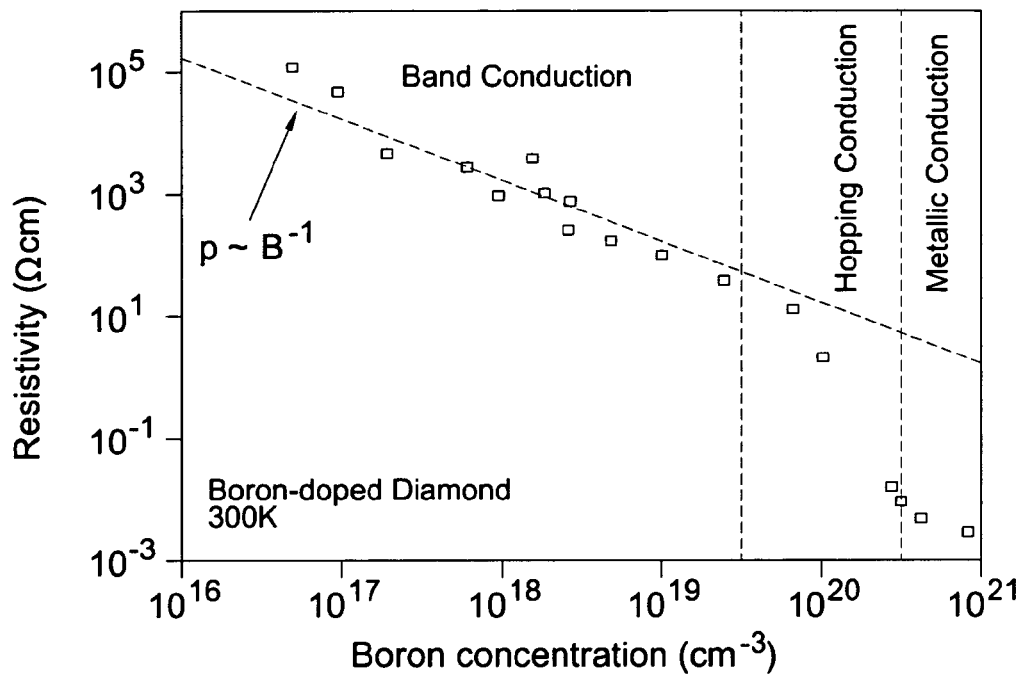
FIG. 5 shows a plot indicating the relationship between resistivity of a synthetic CVD diamond film and boron concentration—the metallic conduction regime is reached at a boron concentration of approximately $4 \times 10^{20}$ $cm^{-3}$.
Figure 6:
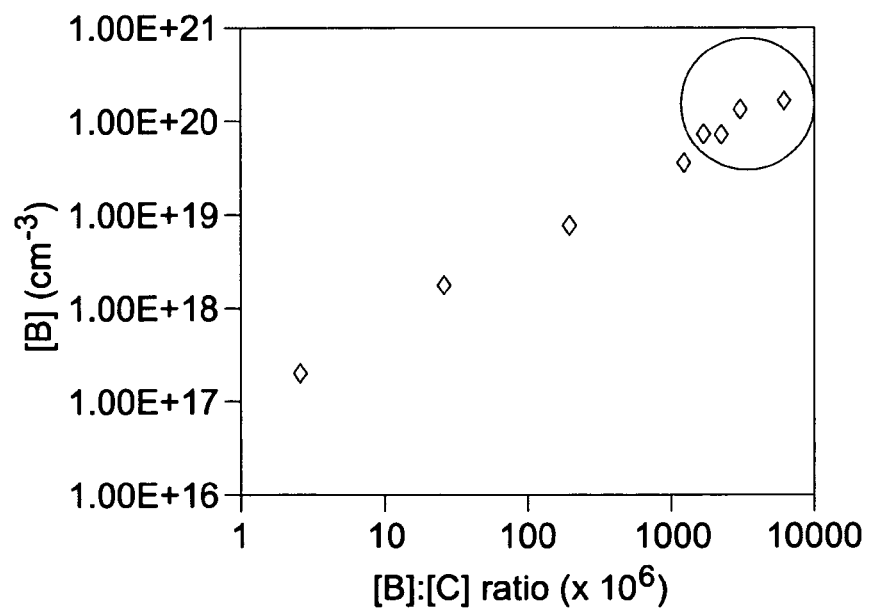
FIG. 6 shows a plot indicating how boron uptake varies as a function of the quantity of boron in the reaction gases—increasing boron in the reaction gases leads to a linear increase in the concentration of boron in a synthetic CVD diamond film up until approximately $4 \times 10^{19}$ $cm^{-3}$ after which no significant increase in concentration of boron in a synthetic CVD diamond film is observed unless process gas flow velocity is increased to achieve metallic conduction as indicated by the ringed graph points.

FIG. 5 shows a plot indicating the relationship between resistivity of a synthetic CVD diamond film and boron concentration. The metallic conduction regime is reached at a boron concentration of approximately $4 \times 10^{20}$ cm$^{-3}$. FIG. 6 shows a plot indicating how boron uptake varies as a function of the quantity of boron in the reaction gas (5% $CH_4$ in $H_2$) using a single axially oriented gas inlet nozzle and a microwave frequency of 2450 MHz. A total gas flow rate of approximately 600 sccm was utilized and boron containing species were introduced into the gas phase leading to a linear increase in boron uptake with boron concentration in the reaction gas until approximately $4 \times 10^{19}$ cm$^{-3}$. However, further increasing boron in the reaction gas had no significant further impact on boron uptake as deduced using SIMS. The desired metallic conduction regime as indicated by the points in the red circle (approximately $4 \times 10^{20}$ cm$^{-3}$ boron atoms in the solid phase) was only achieved by reducing the gas inlet nozzle diameter while maintaining a high total gas flow rate so as to increase the gas flow velocity.

Figure 7:
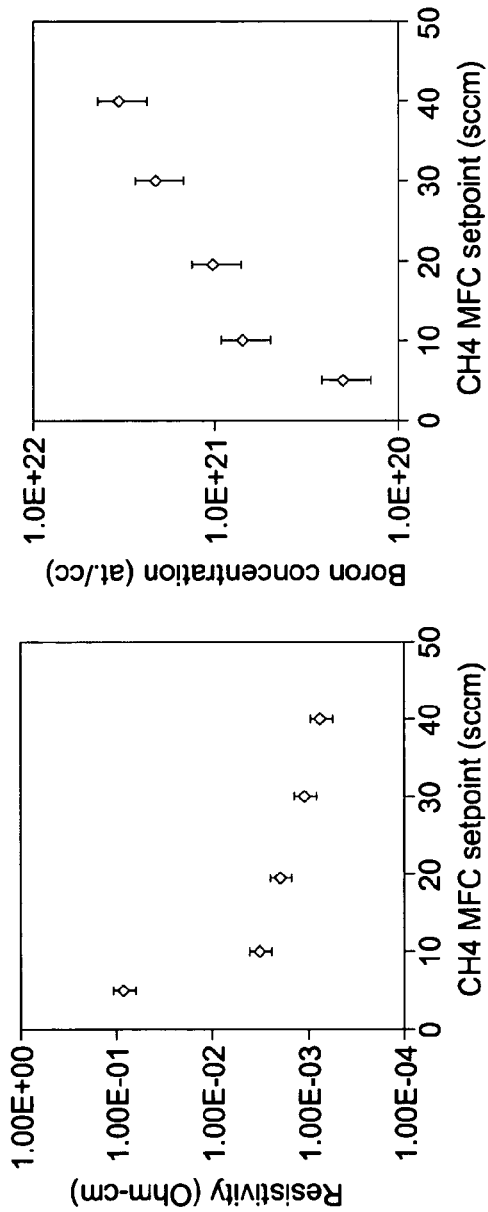
FIG. 7 shows a plot indicating how boron uptake varies as a function of carbon containing gas flow.
Figure 8:
FIG. 8 shows a plot indicating how boron uptake varies as a function of boron containing gas flow.

FIGS. 7 and 8 illustrate the relative dependencies of carbon and boron containing gas flow on solid boron concentration in synthetic CVD diamond material. Experiments were conducted with certain process conditions kept fixed (including 2 mm inlet nozzle diameter, 2.75 kW microwave generator power, a microwave frequency of 2450 MHz, and 90 torr process pressure). For a fixed boron containing gas flow and increasing carbon containing gas flow, the solid boron concentration as measured by secondary ion mass spectrometry (SIMS) increases from $2 \times 10^{20}$ cm$^{-3}$ to $3 \times 10^{21}$ cm$^{-3}$ as illustrated in FIG. 7. Correspondingly, the resistivity of the synthetic boron doped CVD diamond material decreases from $8.6 \times 10^{-2}$ Ω-cm to $7.7 \times 10^{-4}$ Ω-cm. Furthermore, for a fixed carbon containing gas flow and increasing boron containing gas flow, the solid boron concentration as measured by SIMS increases from $2 \times 10^{20}$ cm$^{-3}$ to $2 \times 10^{21}$ cm$^{-3}$ as illustrated in FIG. 8. Correspondingly, the resistivity of the synthetic boron doped CVD diamond material decreases from $1.9 \times 10^{-2}$ Ω-cm to $1.1 \times 10^{-3}$ Ω-cm.

PressurePower Density and Substrate Temperature

In addition to the above, it has been found that providing a gas inlet as previously described enables higher gas flow rates and operating pressures to be utilized within the plasma chamber without arcing occurring within the plasma chamber. Higher operating flow rates and pressures enable higher power densities which equates to a more reactive plasma, i.e. more atomic hydrogen is generated to facilitate increased growth rates and improved quality of CVD diamond product.

It has surprisingly been found that the usable ranges for the synthesis parameters of pressure and power density for the manufacture of synthetic CVD diamond material can be altered by changes in the gas dynamics (flow, geometry etc) for a given gas composition. Typically the upper limit for uniform diamond synthesis in terms of the parameters pressure and power is determined by the onset of monopolar arcs. Those skilled in the art will know that this mono-polar arc limit is affected by experimental factors such as the operating frequency, pressure/power ratio and also the geometry (diameter/thickness) of the substrate.

The present inventors found it surprising that manipulating the gas flow can have a dramatic effect on increasing the operating parameter space in terms of pressure and power while simultaneously not reducing the area of CVD diamond deposition or the uniformity of said deposition. An often encountered limitation in the pressure/power parameter space for growing CVD diamond is the onset of arcing. Embodiments of this invention allow growth of CVD diamond material at higher power densities and pressures than in a conventional synthesis system. In practise the inventors have found that the maximum pressure for operation is increased by >5%, >10%, >15%, >20%, >25%, >30%, or >35% over that which would normally be possible with alternative gas inlet geometries/flows. Furthermore this increase in operating pressure is not at any expense of uniform deposition area. For example, in the case of an operating frequency in a range 800 to 1000 MHz, uniform growth may be achieved to form a disk of CVD diamond having uniform thickness over a diameter in the range 70 to 160 mm. Thickness uniformity may be calculated by measuring the thickness of the CVD diamond disk at various points and calculating the percentage deviation from a mean thickness. For example, at least 10, 15, 17 or 20 measurement points may be taken over at least 70% of a total area of the disk. In accordance with certain embodiments of the present invention the maximum growth thickness variation may be equal to or less than 30%, 25%, 20%, 15%, 10%, 5%, or 2% of a mean thickness of the synthetic CVD diamond disk.

Using embodiments of the present invention it is possible to avoid the problem of arcing within the plasma chamber at operating pressures equal to or greater than: 100, 200, 220, 240, 260, 280, 300, 320, 340, 360, 380, or 400 Torr at a microwave frequency in a range 2300 to 2600 MHz; 120, 140 160, 180, 200, 220, 240, or 260 Torr at a microwave frequency in a range 800 to 1000 MHz; or 60, 70, 80, 100, 120, 140, or 150 Torr at a microwave frequency in a range 400 to 500 MHz. The operating pressure may be equal to or less than 550, 450, 400, 350, or 300 Torr depending on the specific reactor design. For example, a typical operating pressure using a gas inlet nozzle array according to certain embodiments of the present invention may be in the range 200 to 330 Torr for a microwave frequency in a range 2300 to 2600 MHz, 160 to 220 Torr for a microwave frequency in a range 800 to 1000 MHz, or 80 to 140 Torr for a microwave frequency in a range 400 to 500 MHz. Using embodiments of the present invention it has been found that it is possible to achieve a uniform stable plasma at these pressures and uniform CVD diamond growth.

Figure 9:
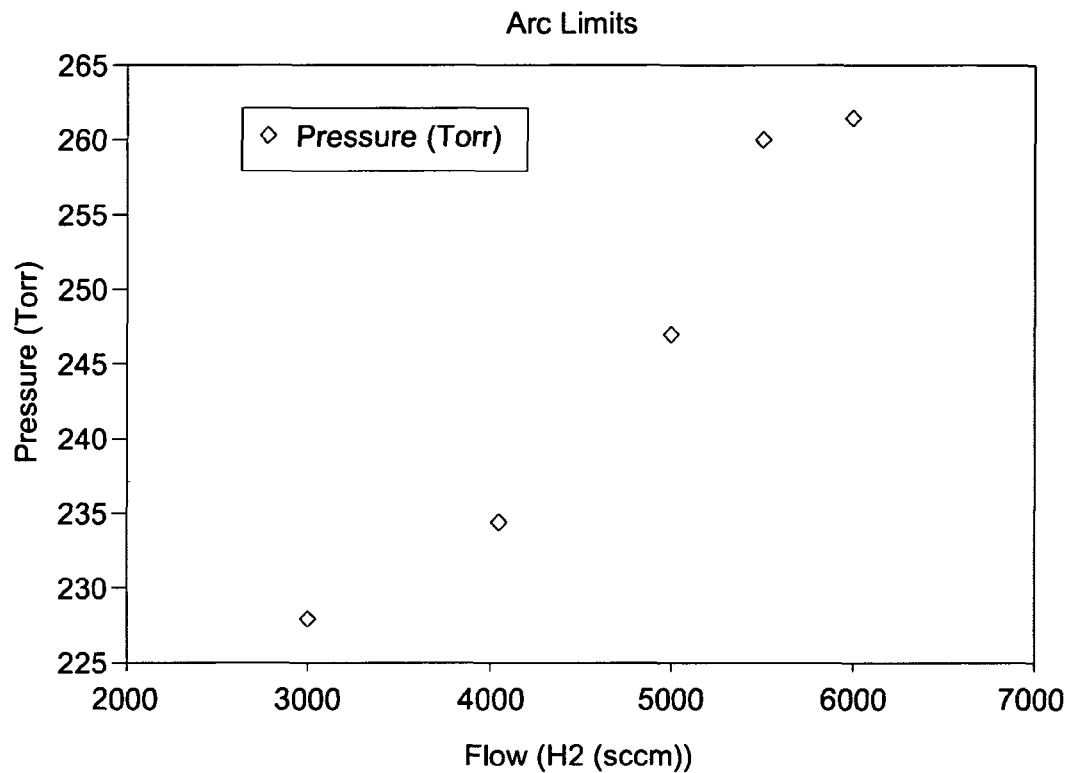
FIG. 9 illustrates how increasing flow rate can be used to access higher operating pressures without onset of arcing.

FIG. 9 shows how the threshold for formation of monopolar arcs can be a very sensitive function of gas flow. In the example shown, the arcing threshold for substantially uniform growth of synthetic CVD diamond material on a 120 mm substrate in an 896 MHz microwave plasma reactor increased from 228 Torr to 262 Torr for a total gas flow change from 3 to 6.0 slpm (standard liters per minute) through six 3 mm diameter gas inlet nozzles arranged in a circular geometry having an array diameter of 37 mm.

Figure 10:
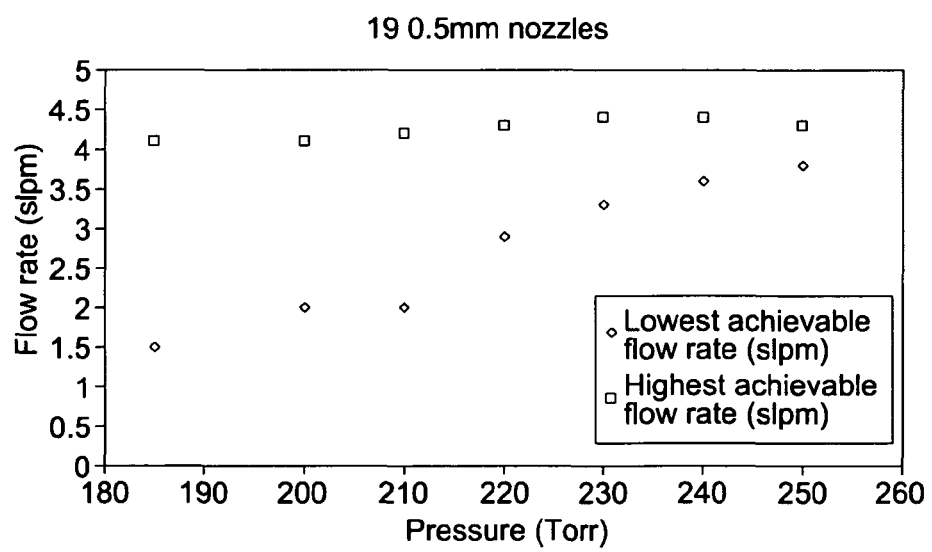
FIG. 10 illustrates how increasing flow rate can be used to access higher operating pressures without onset of arcing and how the range of suitable flow rates narrows at higher pressures.

FIG. 10 illustrates a similar trend showing that substantially uniform synthetic CVD diamond growth over large areas and at high pressure operation is only achievable by using high gas flow rates. As in the previously described example, a 120 mm substrate was with a process gas composition comprising 4% $CH_4$ diluted in $H_2$. However, in this case a hexagonal array of 19 gas inlet nozzles was utilized, each nozzle having a diameter of 0.5 mm. FIG. 10 also illustrates that the gas flow operating window for limiting arc formation decreases in size as the operating pressure increases. As such, the gas flow rate may be carefully selected and controlled so as to be maintained within the stability window for a particular gas inlet nozzle configuration to achieve substantially uniform synthetic CVD diamond growth over large areas and at high operating pressure without the onset of arcing.

Figure 11:
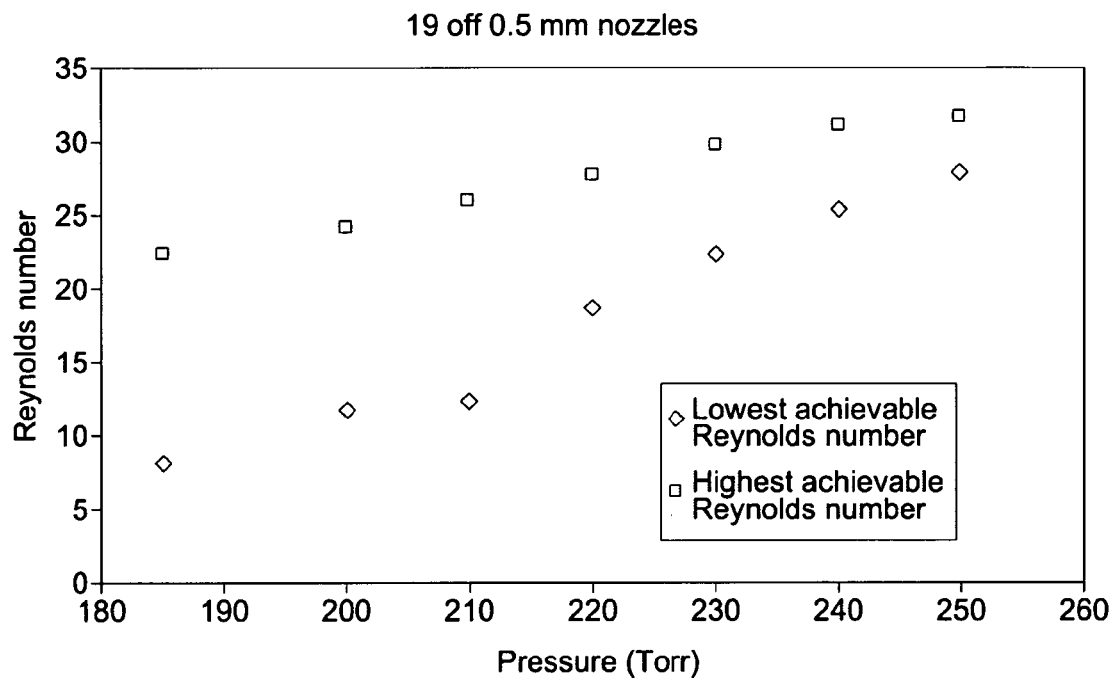
FIG. 11 illustrates how changing gas flow Reynolds number can be used to access higher operating pressures without onset of arcing and how the range of suitable Reynolds numbers narrows at higher pressures.

FIG. 11 illustrates how the threshold for formation of monopolar arcs varies with Reynolds number. The experimental conditions were as described for FIG. 10. This Figure shows that the Reynolds number operating window for limiting arc formation decreases in size as the operating pressure increases. As such, the Reynolds number may be carefully selected and controlled so as to be maintained within the stability window for a particular gas inlet nozzle configuration to achieve substantially uniform synthetic CVD diamond growth over large areas and at high operating pressure without the onset of arcing.

Figure 12:
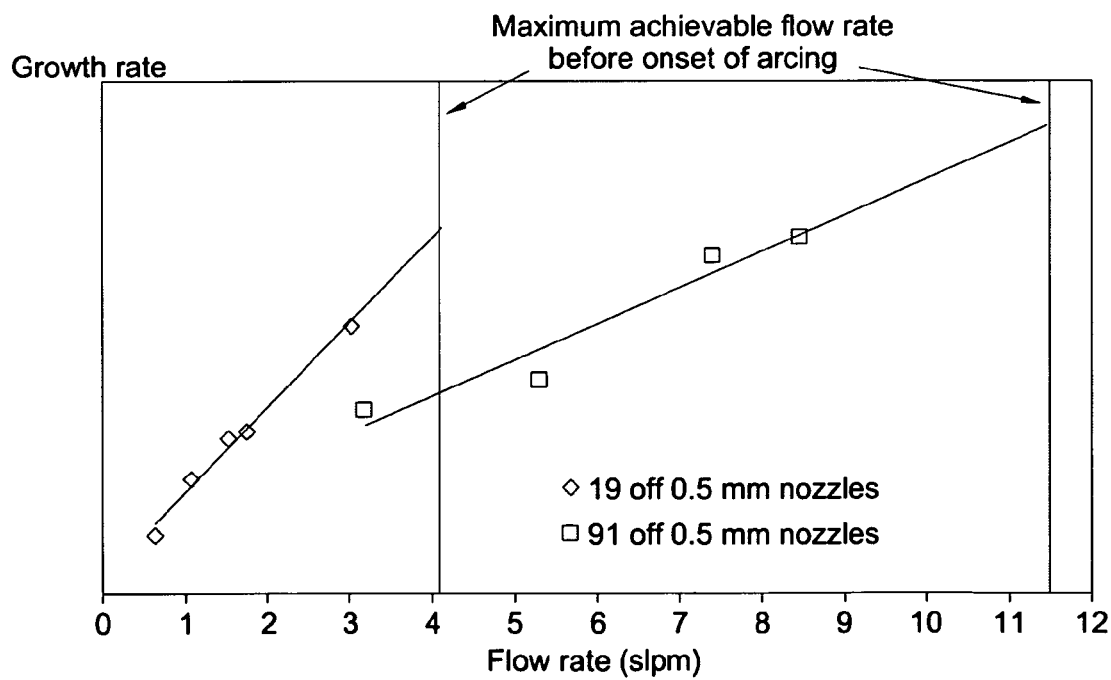
FIG. 12 illustrates that growth rate can increase with flow rate and with an increase in the number of gas inlet nozzles.

FIG. 12 illustrates how growth rate of synthetic CVD diamond material varies with flow rate and number of gas inlet nozzles up to a limit at which arcing occurs. The left hand line in FIG. 12 is for a gas inlet nozzle array comprising 19 nozzles whereas the right hand line is for a gas inlet nozzle array comprising 91 nozzles. In both cases, the diameter of each nozzle was 0.5 mm. The Figure shows that growth rate increases with flow rate for both nozzle configurations but that a higher flow rate and a higher growth rate is achievable prior to onset of arcing using a larger number of nozzles.

The flow characteristics of embodiments of the present invention also allow the plasma reactor to be operated at high power while constraining the plasma to avoid damaging the walls of the chamber and/or the microwave window. The high velocity, highly uniform gas flow within the plasma chamber achieved by embodiments of the present invention allows more power to be introduced at high pressures without the plasma arcing.

Power densities which can be delivered to the substrate may be equal to or greater than 0.05, 0.1, 0.5, 1, 1.5, 2.0, 2.5, 2.75, 3.0, 3.2, or 3.5 $W/mm^2$ of the substrate growth surface. The power density may be equal to or less than 6.0, 5.0, or 4.0 $W/mm^2$ of the substrate growth surface depending on the specific reactor design. For example, a typical operating power density using a gas inlet nozzle array according to certain embodiments of the present invention may be in the range 3.0 to 4.0 $W/mm^2$ of the substrate growth surface.

The power delivered to the substrate also increases with high velocity, highly uniform gas flow, increasing efficiency. That is, a fraction of the total power which is delivered to a substrate is increased. Typically this enables at least 45%, 50%, 55%, 60%, 65%, or 70% of power fed into the plasma chamber to be transmitted through the base of the chamber (opposite to the gas inlet). It has been found that the power transmitted through the base of the chamber approximately equates to hydrogen flux towards the base of the chamber. Accordingly, increasing the power fed through the base of the chamber increases the hydrogen flux to the substrate over the base of the chamber which leads to better quality diamond material being formed over the substrate. It has also been found that utilizing high axial gas flows helps improve the stability of the plasma, leading to more uniform deposition in terms of both growth thickness and quality.

While J. Achard, F. Silva et al. have described that increasing the microwave power density leads to a decrease in boron uptake during CVD diamond growth, the present inventors have found that high boron uptake levels can be achieved at high microwave power densities by using high velocity CVD axial gas flow. This allows better quality doped CVD diamond material to be produced. It may also be noted that the advantageous technical effects of increased pressure and/or power can be applied to plasma chemistries which do not require the dopant as specified in certain aspects of this invention.

In addition to the above, during CVD diamond growth it is advantageous to maintain the substrate on which the CVD diamond material is growing at a temperature in the range 600 to 1300° C., 700 to 1300° C., or 750 to 1200° C. Combining the gas flow conditions as described herein with such substrate growth temperatures allows relatively thick, high quality CVD diamond material to be formed which contrasts with lower temperature thin CVD diamond coatings of metal tools and the like.

Products

Using the previously described apparatus and methods it has been possible to provide more efficient and consistent ways of producing existing products and also produce new products which have not previously been achievable.

According to one aspect of the present invention it is possible to produce large synthetic polycrystalline CVD diamond wafers have a high dopant uniformity. For example, synthetic polycrystalline CVD diamond wafers having a longest dimension equal to or greater than 70 mm, 80 mm, 90 mm, 100 mm, 110 mm, 120 mm, 130 mm, 135 mm, 140 mm, 145 mm or 150 mm may be produced comprising a dopant having a concentration which varies by no more than 50%, 40%, 30%, 20%, 10%, or 5% of a mean value over at least 70% 80%, 90%, or 95% of the volume of the synthetic polycrystalline CVD diamond wafer. In this regard, it should be noted that individual concentration measurements are taken over multiple grains of the polycrystalline material. That is, the measurements are taken on a macroscopic, multi-grain scale. At a scale approach the size of individual grains, concentration variations will occur, for example due to different crystallographic faces having different concentrations of dopant. As such, the technique used for individual measurements must be broad enough to provide a local average over multiple grains. A plurality of such measurements may then be taken at different positions across the wafer. Preferably at least 70%, 80%, 90%, or 95% of the measurements fall within the previously stated concentration ranges. Secondary Ion Mass Spectroscopy (SIMS) may be utilized for measuring dopant concentrations. A spot size area typically 60 μm in diameter may be used for single crystal measurements. For polycrystalline samples, the spot size may be increased to 250 μm in diameter and the average of 4 separate measurements may be taken to obtain a local average.

The synthetic polycrystalline CVD diamond wafer may have a thickness of at least 0.1 mm, 0.2 mm, 0.3 mm, 0.4 mm, 0.5 mm, 0.75 mm, 1 mm, 1.25 mm, 1.5 mm, or 2 mm. Furthermore, the synthetic polycrystalline CVD diamond wafer may have a thickness variation equal to or less than 30%, 25%, 20%, 15%, 10%, 5%, or 2% of a mean thickness. Variations/uniformity values can be calculated as [(max−min)/mean]×100.

The methods described herein are particularly useful for manufacturing large area wafers, e.g. equal to or greater than 140 mm in diameter. However, embodiments also allow better quality smaller diameter wafers to be made when compared with other methods.

Depending on the desired application the dopant may be selected from one of nitrogen, boron, silicon, sulphur, and phosphorous and may be incorporated into the synthetic polycrystalline CVD diamond wafer at a concentration of at least $10^{14}$ cm$^{-3}$, $10^{15}$ cm$^{-3}$, $10^{16}$ cm$^{-3}$, $10^{17}$ cm$^{-3}$, $10^{18}$ cm$^{-3}$, $10^{19}$ cm$^{-3}$, $10^{20}$ cm$^{-3}$, $2\times10^{20}$ cm$^{-3}$, $4\times10^{20}$ cm$^{-3}$, $6\times10^{20}$, $8\times10^{20}$ cm$^{-3}$, $10^{21}$ cm$^{-3}$, $2\times10^{21}$ cm$^{-3}$, $4\times10^{21}$ cm$^{-3}$, $6\times10^{21}$, $8\times10^{21}$ cm$^{-3}$, or $10^{22}$ cm$^{-3}$.

Due to the high operating powers achievable using embodiments of the present invention it is possible to produce very high quality material with low levels of graphite and other undesirable impurities.

Figure 13:
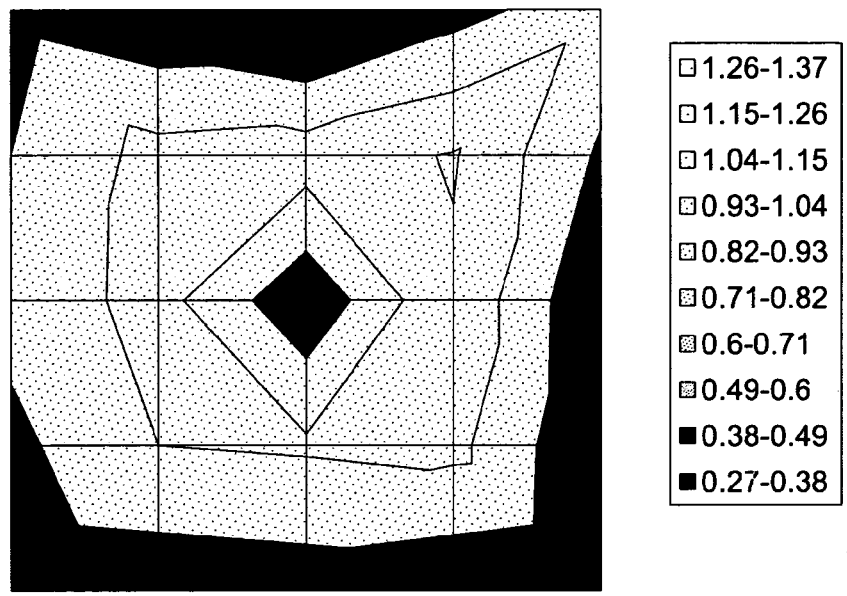
FIGS. 13 to 16 show resistivity maps for synthetic polycrystalline CVD diamond wafers illustrating that doping uniformity can be improved by tailoring gas inlet nozzle diameter and spacing.
Figure 14:
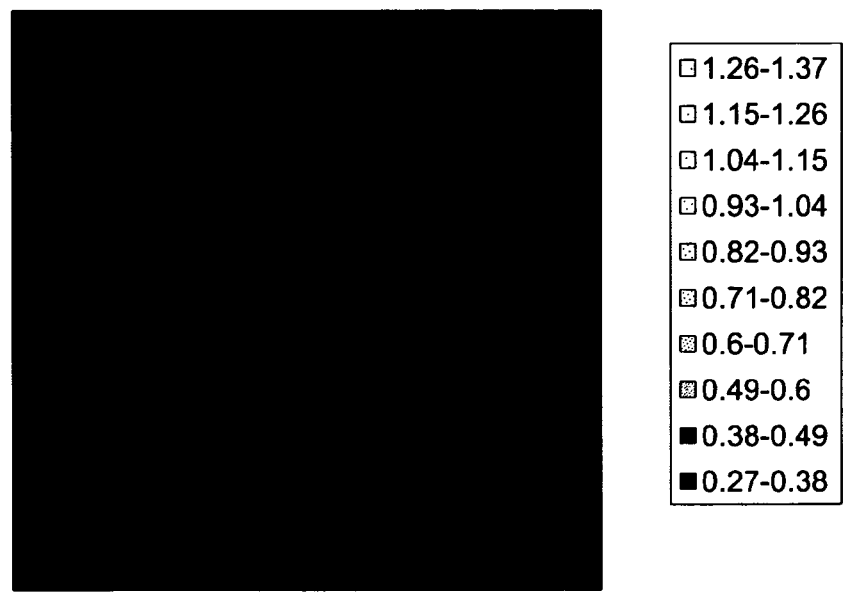

FIGS. 13 and 14 illustrate how boron uniformity may vary in synthetic polycrystalline CVD diamond material as a function of gas inlet nozzle diameter. The Figures show contour plots indicating variations in resistivity across a wafer of polycrystalline CVD diamond material. The resistivity will vary with a variation in boron concentration within the wafer. FIG. 13 illustrates the results for a wafer formed using larger nozzle diameters (six 3.0 mm nozzles in this particular configuration) indicating some variation in resistivity and thus boron concentration. In contrast, FIG. 14 illustrates the results for a wafer formed in an analogous manner but using a gas inlet configuration with smaller nozzle diameters (six 2.5 mm nozzles in this particular configuration) indicating substantially uniform resistivity and thus boron concentration across the wafer. Furthermore, it may be noted that the resistivity of the wafer formed using narrower diameter gas inlet nozzles is low indicating high boron uptake across the entire wafer.

Figure 15:
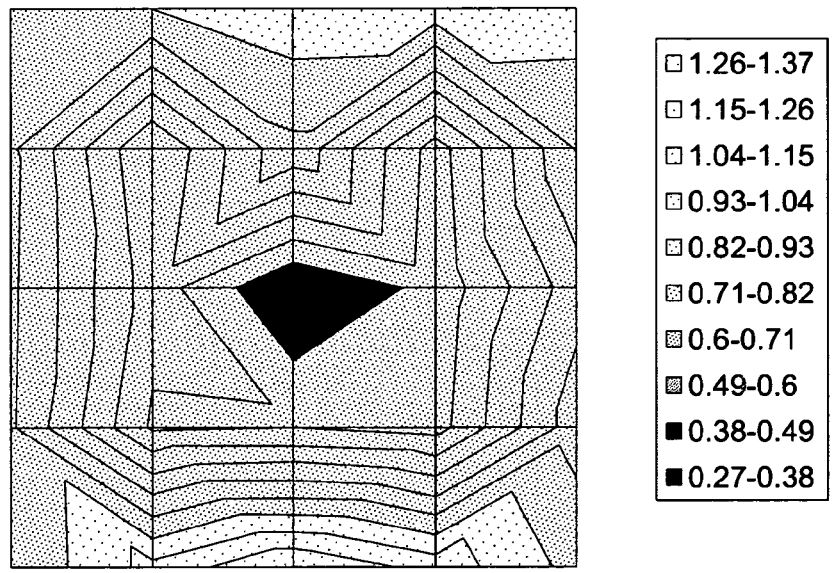
Figure 16:
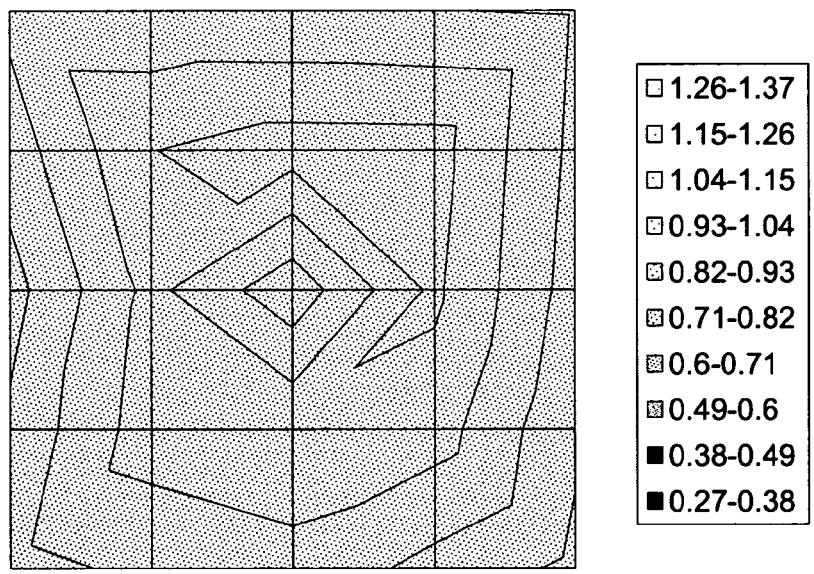

FIGS. 15 and 16 illustrate how boron uniformity may vary in synthetic polycrystalline CVD diamond material as a function of gas inlet nozzle spacing. Again, the Figures show contour plots indicating variations in resistivity across a wafer of polycrystalline CVD diamond material. FIG. 15 illustrates the results for a wafer formed using relatively closely spaced nozzles (six nozzles disposed in a circular array having an array diameter of 25 mm in this particular configuration) indicating some variation in resistivity and thus boron concentration. In contrast, FIG. 16 illustrates the results for a wafer formed in an analogous manner but using a gas inlet configuration with less closely spaced nozzles (six nozzles disposed in a circular array having an array diameter of 37 mm in this particular configuration) indicating substantially uniform resistivity and thus boron concentration across the wafer.

The previously described resistivity measurements were made using a four point probe technique. Four point probe measurements are routinely used in assessing the resistivity of doped silicon wafers in the semiconductor industry. The four point probe technique removes the effects of any contact resistances encountered. The probe itself has four tungsten carbide pins arranged in a line. The four probes are placed in contact with the material to be measured and a current is applied between the two outer pins. The voltage is then measured between the two inner pins. The distance between the pins on the four point probe are large relative to the thickness of the material, for example the thickness of the wafer may be less than 40% of the spacing between each contact probe, and the polycrystalline wafer is assumed to be semi-infinite in lateral dimensions. These two conditions allow a limiting case to be considered where the sheet resistivity is first calculated. This sheet resistivity is given by:

$$R_s = k\left(\frac{V}{I}\right)$$

Where:
V is the measured voltage across the two inner pins of the four point probe I is the current applied to the two outer pins of the four point probe k is a geometric factor which in this case is equal to $$\frac{\pi}{\ln 2}$$

This sheet resistivity ($R_s$) is then multiplied by the thickness of the material to give the resistivity of the material ($\rho$).

For each wafer, 17 points were measured using the four point probe. This consisted of one centre point, 8 points around the edge of the wafer and a further 8 points located on a circle midway between the centre and edge of the wafer. These same 17 points were used to measure the thickness of the wafer. Thus each point on the wafer has a thickness and an associated resistance measurement. Contour plots representing the resistivity of the wafer were then produced using these 17 measured points.

Synthetic polycrystalline diamond wafers may have a mean resistivity equal to or less than 10 Ohm-cm, 1 Ohm-cm, $10^{-1}$ Ohm-cm, or $10^{-2}$ Ohm-cm. Furthermore, the wafers may have a resistivity which varies by no more than ±30%, ±20%, ±10%, or ±5% of a mean resistivity for at least 70%, 80%, 90%, or 95% of at least 17 measurement points taken across at least 70% 80%, 90%, or 95% of an area of the synthetic polycrystalline diamond wafer. Preferably, the measurement method is as previously described above.

It may be noted that when the dopant is boron, it is often easier to measure dopant uniformity indirectly using the aforementioned resistivity measurement technique rather than directly measure the concentration uniformity of boron atoms within the synthetic polycrystalline CVD diamond wafer. Accordingly, a further aspect of the present invention provides a synthetic polycrystalline CVD diamond wafer, said wafer having a longest dimension equal to or greater than 135 mm, 140 mm, or 145 mm and comprising boron dopant, wherein said wafer has a resistivity which varies by no more than ±30%, ±25%, ±20%, ±15%, ±10%, or ±5% of a mean resistivity for at least 70%, 80%, 90%, or 95% of at least 17 measurement points taken across at least 70% 80%, 90%, or 95% of an area of the synthetic polycrystalline diamond wafer. For example, at least 90% of the measurement points may fall with ±25% of the mean resistivity, at least 80% or 90% of the measurement points may fall within ±20% of the mean resistivity, at least 60%, 70%, 80% or 90% of the measurement points may fall with ±15% of the mean resistivity, and most preferably at least 60%, 70%, 80% or 90% of the measurement points may fall with ±10% of the mean resistivity.

For smaller diameter polycrystalline CVD diamond wafers an even higher degree of uniformity can be obtained. Accordingly, another aspect of the present invention provides a synthetic polycrystalline CVD diamond wafer, said wafer having a longest dimension equal to or greater than 70 mm, 80 mm, or 90 mm and comprising boron dopant, wherein said wafer has a resistivity which varies by no more than ±20%, ±15%, ±10%, or ±5% of a mean resistivity for at least 70%, 80%, 90%, or 95% of at least 17 measurement points taken across at least 70% 80%, 90%, or 95% of an area of the synthetic polycrystalline diamond wafer. For example, at least 90% of the measurement points may fall with ±20% of the mean resistivity, at least 80% or 90% of the measurement points may fall within ±15% of the mean resistivity, at least 70%, 80% or 90% of the measurement points may fall with ±10% of the mean resistivity, and most preferably at least 60%, 70%, 80% or 90% of the measurement points may fall with ±5% of the mean resistivity.

According to another aspect of the present invention it is possible to produce a layer of synthetic single crystal CVD diamond material, said layer having a thickness greater than 50 µm, 0.1 mm, 0.2 mm, 0.3 mm, 0.4 mm, 0.5 mm, 0.75 mm, 1 mm, 1.25 mm, 1.5 mm, 2 mm, 2.5 mm, 3 mm, 5 mm, 8 mm, or 10 mm and comprising a dopant having a concentration equal to or greater than $2 \times 10^{20}$ cm$^{-3}$, $4 \times 10^{20}$ cm$^{-3}$, $5 \times 10^{20}$ cm$^{-3}$, $7 \times 10^{20}$ cm$^{-3}$, $1 \times 10^{21}$ cm$^{-3}$, or $2 \times 10^{21}$ cm$^{-3}$. Preferably, the concentration of dopant varies by no more than 50%, 30%, 20%, 10%, or 5% of a mean concentration over at least 70% 80%, 90%, or 95% of the volume of the layer of synthetic single crystal CVD diamond material.

Again, due to the high operating powers achievable using embodiments of the present invention it is possible to produce very high quality material with low levels of graphite and other undesirable impurities. As such, the synthetic single crystal CVD diamond material may comprise a dopant ratio x/y equal to or greater than 2, 5, 10, 20, 50, 100, 500, or 1000, where x is an intentional dopant which may be added to the process gas in a controlled manner to a desired concentration and y is unintentional dopant which may be present as an impurity in the process gas.

Further still, the dopant can be introduced into the synthetic single crystal CVD diamond material while maintaining low levels of extended defects such as dislocations. As such, the single crystal layer may comprise a concentration of dislocation features no more than $10^5$, $10^4$, $10^3$ cm$^{-2}$ and a birefringence no more than $4 \times 10^{-4}$, $1 \times 10^{-5}$, $5 \times 10^{-5}$, $1 \times 10^{-6}$.

The layer of synthetic single crystal CVD diamond material is grown on a substrate having a growth surface oriented substantially in a {111}, {113}, {110}, or {100} crystallographic plane (e.g., at least within 15°, 10°, or 5° of said crystallographic plane) so as to produce a doped single crystal layer orientated in a {111}, {113}, {110}, or {100} crystallographic plane. Furthermore, the layer of synthetic single crystal CVD diamond material at the thickness grown shows no, or substantially no, twins or large doping non-uniformities characteristic of defective growth.

In one particular example, the layer of synthetic single crystal CVD diamond material is grown on a substrate having a growth surface oriented substantially in a {100} crystallographic plane (e.g., at least within 15°, 10°, or 5° of a {100} crystallographic plane) so as to produce a doped single crystal layer orientated in a {100} crystallographic plane. In this regard, it should be noted that the uptake of dopant varies according to the crystallographic orientation of the growing CVD diamond layer. Conventionally, most synthetic single crystal CVD diamond material is grown in a {100} crystallographic orientations for reasons of growth rate, morphology, and low uptake of dopants. However, it has not previously been possible to incorporate high levels of dopant into this orientation of synthetic single crystal CVD diamond material. In contrast, using the apparatus and methods described herein it has been found to be possible to achieve high dopant levels in this crystallographic orientation, e.g. equal to or greater than $2 \times 10^{20}$ cm$^{-3}$, $4 \times 10^{20}$ cm$^{-3}$, $5 \times 10^{20}$ cm$^{-3}$, $7 \times 10^{20}$ cm$^{-3}$, $1 \times 10^{21}$ cm$^{-3}$, or $2 \times 10^{21}$ cm$^{-3}$.

In addition to the above, it is possible to vary the concentration of dopant during a growth run to form a synthetic CVD diamond material comprising doped and undoped layers and/or layers having different concentrations of dopant. For example, conductive and semi-conductive component features may be formed within a synthetic single crystal CVD diamond to achieve electronic device structures such as diodes and transistors. While such structures have been proposed in the art, embodiments of the present invention allow a higher degree of dopant control so as to achieve better functional performance. For example, a layered synthetic single crystal CVD diamond may be formed having a dopant concentration, for example boron, which varies by at least a factor of 3, 10, 30, 100, 300, 1000, 30000, or 100000 over a thickness of no more than 10 µm, 3 µm, 1 µm, 0.3 µm, 0.1 µm, 0.03 µm, 0.01 µm, 0.003 µm, or 0.001 µm. Embodiments thus allow the concentration of dopant to be changed quickly through a thickness of as grown CVD diamond material while maintaining dopant uniformity across a specific layer within the CVD diamond material. For example, the dopant level in the CVD diamond material may be ramped up very quickly from undoped material to form a doped layer or ramped down quickly to move from a doped layer to an undoped layer over a short distance within the CVD diamond material. The later has been found to be particularly problematic using prior art methods. That is, doped layers within a CVD diamond material can be formed with well defined boundaries using high flow rates directed towards a growth surface of the CVD diamond material. Furthermore, such well defined layers can be formed in a single growth run. This can be very important in electronic applications using boron doped layers. Previous attempts to form very well defined layers have involved growing a doped layer in one growth run and then transferring the material into another reactor to grow undoped material thereon as is was found to be difficult to sharply cut off the dopant being taken up by the synthetic CVD diamond material during a single growth run. However, this technique inevitably results in impurities, typically nitrogen or silicon, being incorporated at the interface between the doped layer and the overlying layer. This problem can be solved by using the methods described herein to form a sharply defined doped layer in a single growth run. That is, using high velocity gas flows and/or a suitable Reynolds number can allow the formation of a synthetic single crystal CVD diamond comprising a doped layer and an adjacent undoped layer, wherein an interface between the doped and undoped layer is substantially free of impurities and wherein the dopant concentration varies by at least a factor of 3, 10, 30, 100, 300, 1000, 30000, or 100000 over a thickness of no more than 10 µm, 3 µm, 1 µm, 0.3 µm, 0.1 µm, 0.03 µm, 0.01 µm, 0.003 µm, or 0.001 µm across the interface between the doped and undoped layers.

An interface substantially free of impurities may be defined as an interface where, in a region either side of the interface extending to 20%, 50%, or 100% of a thickness of the doped layer, the impurity concentration does not exceed $10^{14}$, $3 \times 10^{14}$, $10^{15}$, $3 \times 10^{15}$, $10^{16}$, $3 \times 10^{16}$, or $10^{17}$, and does not vary in concentration by more than a factor of 2, 3, 5, 10, 30, 100, 300, or 1000. Multiple profile measurements may be taken across an interface to show that this criteria is met across substantially all the interface, e.g. a measurement may be made 1, 2, 3, 5, or 10 times at 1 mm spacings along a line across the interface with all measurements meeting the required criteria.

The layered synthetic single crystal CVD diamond may comprise a doped layer which has one or more of the characteristics of the layer of synthetic single crystal CVD diamond material previous described. However, the doped layer may also by made thinner than the previously described layer of synthetic single crystal CVD diamond material. For example, the doped layer may have a thickness of at least 1 nm, 5 nm, 10 nm, 20 nm, 50 nm, 100 nm, 500 nm, or 1 µm and thus be less thick than the 50 µm limit previous described. Alternatively, a thicker doped layer of at least 50 µm or more may be provided as previously described. The required thickness will depend on the desired application. For some electronic applications very thin layers of boron doped material are desirable. The present invention allows such layers to be made with well defined upper and lower interfaces, with substantially no interface impurities, and with high uniformity of dopant in the plane of the layer In addition to the above, embodiments of the present invention allow a plurality of synthetic single crystal CVD diamonds to be synthesised at a high growth rate and doped with a high degree of uniformity in a single CVD growth run. For example, at least 10, 20, 30, 40, 50, or 60 synthetic single crystal CVD diamonds may be grown in a single growth run, the synthetic single crystal CVD diamonds having a thickness which varies by no more than 20%, 10%, or 5% of a mean thickness. In measuring thickness variations, at least 20, 40, 60, 80, or 100 samples may be measured, e.g. 20 randomly selected single crystals across an array of as grown samples. The measurements may be such that 100% of the measurements fall within ±10% of a mean value, at least 90%, more preferably 95%, fall within ±5% of a mean value, at least 80%, more preferably 85%, fall within ±3% of a mean value, at least 60%, more preferably 70%, fall within ±2% of a mean value, and at least 30%, more preferably 35%, fall within ±1% of a mean value. Furthermore, greater than 80% of the measured as-grown samples can have a morphology consistent with an alpha parameter of 2±0.3. Further still, the measured room temperature absorption coefficient for all of more than 20 randomly selected samples may be one or more of: equal to or less than 2.5 cm$^{-1}$ at 270 nm (characteristic of a single substitutional nitrogen concentration equal to or less than 0.15 ppm); equal to or less than 1.5 cm$^{-1}$ at 350 nm; and equal to or less than 0.7 cm$^{-1}$ at 510 nm.

Figure 17:
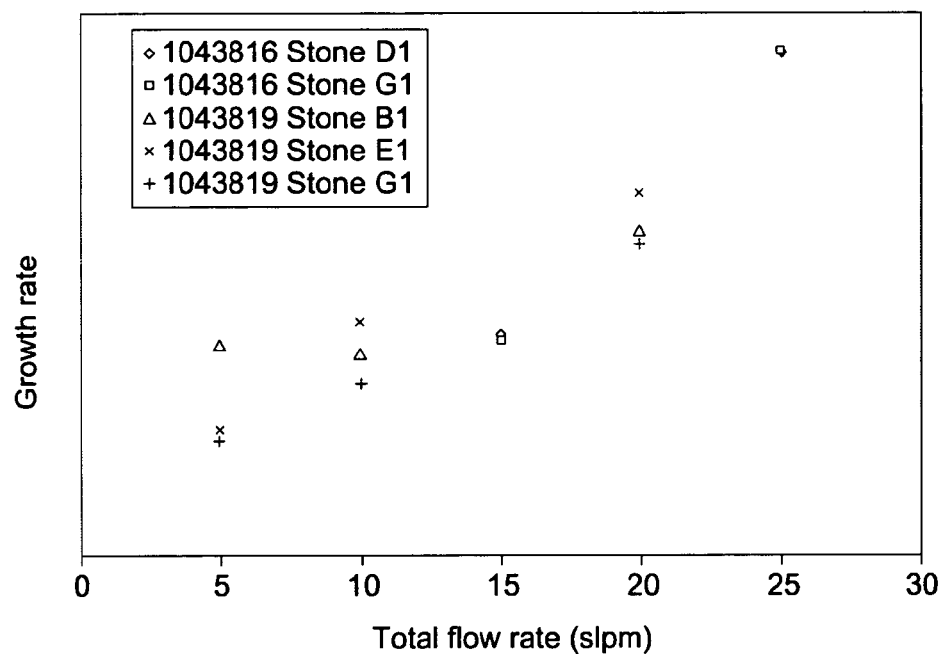
FIG. 17 illustrates how growth rate of a plurality of synthetic single crystal CVD diamonds increases with process gas flow rate.

In this regard, FIG. 17 illustrates that growth rate of the plurality of single crystals increases substantially uniformly with an increase in total process gas flow rate. In this example, the process gas comprises 0.5 ppm added N$_2$ gas in 5% CH$_4$:H$_2$. Sixty type Ib substrates were arranged symmetrically onto a 120 mm substrate. Post growth analysis shows that their morphology corresponded to an alpha parameter of 2±0.2. The growth rate of the plurality of synthetic single crystal CVD diamonds varies by no more than about 3%. As such, a high degree of thickness uniformity (e.g. less than 10%) can be achieved for a total thickness of, for example, 3.3 mm. The nitrogen concentration as measured using transmission measurement sampling of approximately 40% of the stone was 0.10±0.05 ppm. As such, uniform nitrogen uptake in the plurality of single crystals was achieved. Such a process may be used to form high quality optical CVD diamond material, e.g. for diamond window or Raman laser applications. The methods described herein can achieve a high degree of uniformity in terms of optical properties across a plurality of single crystals grown in a single growth run.

Summary

In light of the above, it will be evident that embodiments of the present invention enable uniform doping to be achieved over large areas of, for example, polycrystalline diamond material and/or over a large number of single crystal diamonds grown in a single growth run. Furthermore, very high levels of doping can be achieved for electronic and sensor applications.

Embodiments of the present invention have also been able to achieve uniform and consistent product at high growth rates and over large areas. Furthermore, embodiments of the present invention have enabled the synthesis of products which have not been possible to produce using prior art methods such as high boron concentration single crystal diamond material, particularly {100} oriented single crystal material.

In addition to improve dopant uniformity in synthetic CVD diamond material, certain embodiments of the present invention can also improve uniformity of other material parameters. For example, improvement in uniformity can be measured by one or more of the following parameters: thickness uniformity of a CVD diamond film (across the deposition area as defined by $R_s$); uniformity of one or more quality parameters of the diamond material (e.g. colour, optical properties, electronic properties); in polycrystalline diamond material, uniformity of texture, surface morphology, grain size, etc. . . . ; or in single crystal diamond material where growth takes place on an array of single crystal diamond substrates on a substrate carrier, uniformity of thickness, morphology, edge twinning, lateral growth, etc. . . . , between each single crystal.

The key parameters chosen for assessing uniformity depend on the synthesis process, the economics of fabricating the final product from the synthesis product, and the requirements of the final product itself. For example, for an array of single crystal diamonds, consistent morphology between adjacent crystals enabling efficient material utilisation may be more important than minor variations in colour, particularly when the material is used in cutting applications. Conversely, in boron doped material the uniformity of boron uptake may be the critical factor. The behaviour of boron in a synthesis reactor is of note here. The tendency is for boron containing gases to deplete rapidly to adjacent surfaces once the gas is broken down. Accordingly, achieving uniformity in boron incorporation in a diamond film may be quite different to achieving uniformity in growth rate or morphology in intrinsic diamond where depletion of carbon containing species occurs much less quickly.

While this invention has been particularly shown and described with reference to preferred embodiments, it will be understood to those skilled in the art that various changes in form and detail may be made without departing from the scope of the invention as defined by the appendant claims.

The invention claimed is:

1. A method of manufacturing synthetic CVD diamond material, the method comprising:
   providing a microwave plasma reactor comprising:
   a plasma chamber;
   one or more substrates disposed in the plasma chamber providing a growth surface area over which the synthetic CVD diamond material is to be deposited in use;
   a microwave coupling configuration for feeding microwaves from a microwave generator into the plasma chamber; and
   a gas flow system for feeding process gases into the plasma chamber and removing them therefrom,
   injecting process gases into the plasma chamber;
   feeding microwaves from the microwave generator into the plasma chamber through the microwave coupling configuration to form a plasma above the growth surface area or below the growth surface area if the microwave plasma reactor is in an inverted arrangement with process gases flowing in an upwards direction; and growing synthetic CVD diamond material over the growth surface area, wherein the gas flow system includes a gas inlet comprising one or more gas inlet nozzles disposed opposite the growth surface area and configured to inject process gases towards the growth surface area;

wherein the microwave coupling configuration comprises a microwave window for feeding microwaves from the microwave generator into the plasma chamber, the microwave window being disposed at an opposite end of the plasma chamber to the growth surface area;

wherein the process gases are injected into the plasma chamber through the one or more gas inlet nozzles with a Reynolds number in a range of 1 to 100;

wherein the plasma chamber is configured to support a $TM_{011}$ standing microwave mode;

wherein the one or more gas inlet nozzles are integrally formed in a metallic wall of the plasma chamber disposed opposite the growth surface area; and wherein the microwave window is in the form of an annular dielectric window disposed around the metallic wall of the plasma chamber in which the one or more gas inlet nozzles are disposed; and wherein a power density delivered to the growth surface area is equal to or greater than 1 W/mm² of the growth surface area.

2. A method according to claim 1, wherein the process gases comprise at least one dopant in gaseous form, selected from one or more of boron, silicon, sulphur, phosphorous, lithium, and beryllium, the or each dopant present at a concentration equal to or greater than 0.01 ppm, and/or nitrogen at a concentration equal to or greater than 0.3 ppm.

3. A method according to claim 1, wherein the at least one dopant comprises: one or more of boron, silicon, sulphur, phosphorous, lithium and beryllium and wherein the process gases comprise less than 0.3 ppm nitrogen; or nitrogen at a concentration of equal to or greater than 0.3 ppm and wherein the process gases comprise less than 0.01 ppm of the each of boron, silicon, sulphur, phosphorous, lithium and beryllium.

4. A method according to claim 1, wherein the at least one dopant is provided in the process gases at a concentration equal to or greater than 0.05 ppm, 0.1 ppm, 0.3 ppm, 0.5 ppm, 0.7 ppm, 1 ppm, 3 ppm, 5 ppm, 10 ppm, 20 ppm, 50 ppm, 100 ppm, 200 ppm, 300 ppm, 500 ppm, 700 ppm, or 1000 ppm.

5. A method according to claim 1, wherein the process gases comprise a ratio of dopant concentration/carbon concentration equal to or greater than $1 \times 10^{-6}$, $10 \times 10^{-6}$, $100 \times 10^{-6}$, or $1000 \times 10^{-6}$.

6. A method according to claim 1, wherein the process gases are injected towards the growth surface area at a total gas flow rate equal to or greater than 500, 750, 1000, 2000, 5000, 10000, 15000, 20000, 25000, 30000, 35000, or 40000 standard cm³ per minute.

7. A method according to claim 1, wherein the total gas flow fed through the gas inlet is equal to or greater than 3, 10, 20, 50, 100, 200, 500, or 1000 standard cm³ per cm² of the growth surface area and equal to or less than 50000, 20000, 10000, or 5000 standard cm³ per cm² of the growth surface area.

8. A method according to claim 1, wherein the one or more gas inlet nozzles have an outlet diameter in the range 0.1 mm to 5 mm, 0.2 mm to 3.0 mm, 2.0 mm to 3 mm, 0.2 mm to 2 mm, 0.25 mm to 2 mm, or 0.25 mm to 1.5 mm.

9. A method according to claim 1, wherein a minimum distance $D_c$ between the gas inlet and the growth surface area is less than or equal to $6R_s$, $4R_s$, or $2R_s$, where $R_s$ is a radius of the growth surface area.

10. A method according to claim 1, wherein the process gases are injected into the plasma chamber through the one or more gas inlet nozzles with a Reynolds number equal to or less than 100, 80, 50, 40, or 35 and at least 1, 5, 10, 15, 20, or 25.

11. A method according to claim 1, wherein an operating pressure within the plasma chamber is equal to or greater than: 100, 200, 220, 240, 260, 280, 300, 320, 340, 360, 380, or 400 Torr (13.3, 26.7, 29.3, 32.0, 34.7, 37.3, 40.0, 42.7, 45.3, 48.0, 50.7, 53.3 kPa) at a microwave frequency in a range 2300 to 2600 MHz; 120, 140 160, 180, 200, 220, 240, or 260 Torr (16.0, 18.7, 21.3, 24.0, 26.7, 29.3, 32.0, 34.7 kPa) at a microwave frequency in a range 800 to 1000 MHz; or 60, 70, 80, 100, 120, 140, or 150 Torr (8.0, 9.3, 10.7, 13.3, 16.0, 18.7, 20.0 kPa) at a microwave frequency in a range 400 to 500 MHz.

12. A method according to claim 1, wherein at least 45%, 50%, 55%, 60%, 65%, or 70% of power fed into the plasma chamber is transmitted through a base of the plasma chamber disposed opposite to the gas inlet.

13. A method according to claim 1, wherein a power density delivered to the growth surface area is equal to or greater than 1.5, 2.0, 2.5, 2.75, 3.0, 3.2, or 3.5 W/mm² of the growth surface area.

14. A method according to claim 1, wherein the gas inlet comprises an inlet nozzle array comprising a plurality of gas inlet nozzles disposed opposite the growth surface area and configured to inject process gases towards the growth surface area.

* * * * *